United States Patent
Matsui et al.

(10) Patent No.: US 6,392,956 B2
(45) Date of Patent: May 21, 2002

(54) SEMICONDUCTOR MEMORY THAT ENABLES HIGH SPEED OPERATION

(75) Inventors: Yoshinori Matsui, Tokyo; Hiroyuki Yamakoshi, Kanagawa, both of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/863,322

(22) Filed: May 24, 2001

(30) Foreign Application Priority Data

May 25, 2000 (JP) ........................................ 2000-155512

(51) Int. Cl.[7] ................................................. G11C 8/00
(52) U.S. Cl. .............. 365/230.06; 365/200; 365/230.03
(58) Field of Search ............................ 365/230.06, 200, 365/230.03

(56) References Cited

U.S. PATENT DOCUMENTS 5,995,429 A * 11/1999 Kojima et al. .......... 365/230.06
6,064,609 A * 5/2000 Jung et al. .................. 365/200

FOREIGN PATENT DOCUMENTS

| JP | 08-87884 | 4/1996 |
|----|----------|--------|
| JP | 2842181 | 10/1998 |
| JP | 11-144458 | 5/1999 |
| JP | 11-203858 | 7/1999 |
| JP | 11-288587 | 10/1999 |

* cited by examiner

Primary Examiner—Huan Hoang
(74) Attorney, Agent, or Firm—Sughrue Mion, PLLC

(57) ABSTRACT

A semiconductor memory includes a block selection circuit, a redundancy main word decoder, a word reset circuit, and a word driver circuit. The block selection circuit outputs a block selection signal based on an address signal. The redundancy main word decoder generates a redundancy main word signal in response to the block selection signal. The word reset circuit outputs a word reset signal in response to the redundancy main word signal. The word driver circuit drives one of word lines in response to the word reset signal, a main word signal indicating selection of the word driver circuit, and a word decode signal indicating selection of the one of word lines.

28 Claims, 17 Drawing Sheets

SEMICONDUCTOR MEMORY THAT ENABLES HIGH SPEED OPERATION

BACKGROUND OF THE INVENTION

1. Field of the Invention

The present invention relates to a semiconductor memory. More particularly, the present invention relates to a semiconductor memory suitable for DRAM that enables a high-speed operation.

2. Description of the Related Art

FIG. 1 is a block diagram showing the configuration of a conventional technique. A semiconductor memory divided into regions of predetermined units referred to as blocks. Each block is selected by using a block selection signal BS that is an output from a block selection circuit 1.

This semiconductor memory is provided with a memory cell section 5, a redundancy memory cell section 6, a word reset circuit 27, pre-charge circuits 31 and sense amplifiers 32.

The memory cell section 5 makes a predetermined memory cell 11 active based on an main word decoder address signal MWDA and a block selection signal BS. The redundancy memory cell section 6 makes a predetermined redundancy memory cell 21 active based on a redundancy word selection signal RWS and a block selection signal BS. The word reset circuit 27 generates a word reset signal WLR from a block selection signal, and also controls a selected word driver circuit 14 and a redundancy word driver circuit 24. The pre-charge circuit 31 charges bit lines to (½) VCC. The sense amplifier 32 amplifies a cell data read out to the bit lines.

The memory cell section 5 comprises memory cells 11, a word decoder 13, word driver circuits 14 and a main word decoder 15.

The memory cells 11 are the memory cells for storing data. The word decoder 13 outputs word decode signals (only two signals RA, RA+1 are shown as the representation) based on an address signal from an address buffer 4 and a block selection signal BS. The word driver circuit 14 drives word lines (only two lines WL, WL+1 are shown as the representation) selected by the word decode signals (RA, RA+1) in order to make the predetermined memory cells 11 active. There is a plurality of word driver circuits 14 in the memory cell section 5. The main word decoder 15 generates a main word signal which changes the potential level of the main word lines (WLP to WLP+n) in order to select a predetermined word driver circuit 14 from the plurality of word driver circuits 14.

The memory cell section 6 comprises redundancy memory cells 21, a redundancy word decoder 23, a redundancy word driver circuit 24 and a redundancy main word decoder 25. The redundancy memory cells 21 are the memory cells for storing data. The redundancy word decoder 23 outputs redundancy word decode signals (only two signals RRA, RRA+1 are shown as the representation) based on a block selection signal BS. The redundancy word driver circuit 24 drives redundancy word lines (only two lines RWL, RWL+1 are shown as the representation) selected by the redundancy word decode signals (RRA, RRA+1) in order to make the predetermined redundancy memory cell 21 active. The redundancy main word decoder 25 generates a redundancy main word signal, which changes the potential level of the redundancy main word line RWLP in order to select a redundancy word driver circuit 24.

The memory cell 11 and the redundancy memory cell 21 comprise n-MOSFETs and capacitance elements, respectively as shown in FIG. 4. The standard potential is (½) VCC.

FIG. 2 shows the conventional reset circuit. The word reset circuit 27 is provided with a delay circuit 27a, a NAND 27b, inverter 27c and inverter 27d.

The word driver circuit 14 is controlled based on a voltage of the main word line WLP. It comprises a transistors T1 to T8.

The transistor T1 has a source connected to the word decoder 13, a gate connected to the drain of the transistor T2, and a drain connected to one of word lines WL. The transistor T1 makes one of word lines WL active by using the word decode signal RA. The transistor T2 has a source connected to the main word decoder 15, a gate connected to a high potential level power supply VCC, and a drain connected to the gate of the transistor T1. The transistor T3 has a source connected to a low potential level power supply GND, a gate connected to a pull-down signal line 14L for the pull-down signal 14a, and a drain connected to the word line WL. The transistor T102 makes the active word line WL inactive by using a pull-down signal 14a. The transistor T4 has a source connected to a pull-down signal line 14L for the pull-down signal 14a, a gate connected to an output of the word reset circuit 27, and a drain connected to a high potential level power supply VCC. The transistor T5 has a source connected to a low potential level power supply GND, a gate connected to the main word line WLP, and a drain connected to the pull-down signal line 14L.

Since the transistors T6 to T8 correspond to the transistors T1 to T3 respectively, the explanation for the transistors T6 to T8 are omitted.

The redundancy word driver circuit 24 is configured similarly to that of the word driver circuit 14. The redundancy word driver circuit 24 is designed so as to be selected by using the word reset signal WLR of the word reset circuit 27.

In the conventional operation of activating a word line WL, the operation timing having the above-mentioned configuration will be described below with reference to FIG. 5.

In the conventional circuit, the redundancy main word line RWLP is not operated in a case of a selection of the memory cell 11. It is operated only when the redundancy cell 21 is selected. Thus, the input of the word reset circuit 27 uses the block selection signal BS.

It is necessary to prevent an penetration current (excessive current) from flowing through the transistors T4 and T5, when the transistors T4 and T5 of FIG. 2 are turned on at the same time. It occurs at the timing that the word reset signal WLR is activated at the same timing of pulling up the potential level of main word line WLP.

An general decoder circuit is constituted by several stages of logical gates, as illustrated by an example shown in FIG. 3. Typically, as the number of addresses is increased, the number of gate stages is increased, and a gate delay is also added.

The word reset circuit 27 has a delay circuit, correspondingly to the configuration of the main word decoder circuit. The delay circuit is adjusted so that the transistors T4 and T5 of FIG. 2 are not turned on at the same time.

As for the operational timing to select a predetermined word driver circuit 14 from the plurality of word driver circuits 14 in FIG. 5, firstly, the block selection signal BS becomes the high potential level. At a time t1, the transistor T4 is on, and the transistor T5 is off. After the time t1, the word reset signal WLR becomes the low potential level. At a time t3, both the transistors T4 and T5 are off. After the time t3, the main word line WLP becomes the high potential level. At and after a time t5, the transistor T4 is off, and the transistor T5 is on. After the time t5, a contact R becomes the low potential level.

Also, to deselect a predetermined word driver circuit 14, firstly, the block selection signal BS becomes the low potential level. Then, the main word line WLP becomes the low potential level. At a time t4, both the transistors T4 and T5 are off. After the time t4, the word reset signal WLR becomes the high potential level. At the time t6, the transistor T4 is on, and the transistor T5 is off. After a time t6, the contact R becomes the high potential level.

By considering the yield of the memory cell array, especially by considering the using redundancy memory cells 21, this is designed so as to give a margin to the time t4 by using the delay circuit 27a.

In this way, the above-mentioned circuits can attain the expected operation by using the delay circuit 27a. However, the rising timing of the word reset signal WLR is delayed in order to reserve the operational margin. Thus, it is difficult to make the speed of the operation faster.

In conjunction with the above description, the semiconductor memories are disclosed in Japanese Patent Publication and Japanese Laid Open Patent Application.

Japanese Patent Publication No. 2842181 discloses the following semiconductor memory. The semiconductor memory is provided with memory cell arrays, a plurality of word line drivers, and a decoder. The memory cell arrays are divided into a plurality of groups. The plurality of word line drivers is mounted correspondingly to the groups in order to drive respective word lines mounted in word directions of those memory cell arrays. The decoder for decoding an outer address, and thereby generating a word line selection signal, and then controlling the plurality of word line drivers selectively and actively. So, this also contains a generator for generating a word line reset signal which becomes active at a reset time prior to the execution of an operation for selecting the word line, and then resetting the word line. All the word lines are set parallel to each other. The word line reset signal common to the respective word line drivers is set vertical to the word line.

Japanese Laid Open Patent Application (JP-A-Heisei, 8-87884) discloses the following semiconductor memory. The semiconductor memory is provided with word lines, line decoders, word drivers, and word reset transistors. The word lines are to make memory cells arranged in a form of matrix active. The line decoders are for controlling voltages of the respective word lines. First and second transistors that are connected in series between the word line and a ground constitute the word reset transistor. The first transistor is controlled by an output signal from the line decoder. In the second transistor, its gate voltage is applied while a power supply besides the boost power supply and a low voltage power supply whose potential level is lower than the power supply besides the boost power supply and the boost power supply are temporally switched.

Japanese Laid Open Patent Application (JP-A-Heisei, 11-144458) discloses the following semiconductor integrated circuit device. The semiconductor integrated circuit device is provided with a main word driver, a main word driver unit, and a negative word line manner of a level conversion sub-word driver. The main word driver is for outputting a drive signal to drive a main word line based on a pre-decode signal, and a selection signal corresponding to the driven main word line. The main word driver unit is composed of a first booster for boosting the selection signal of the main word driver to a first voltage and a second booster for boosting the drive signal of the main word driver to the first voltage. The negative word line manner of the level conversion sub-word driver is for: sending the first voltage of the first booster to a sub-word line when it is selected by the selection signal and the drive signal of the main word driver; converting standard potential into a first negative voltage and sending it to the sub-word line when it is not selected.

Japanese Laid Open Patent Application (JP-A-Heisei, 11-203858) discloses the following word line driver and semiconductor memory. The word line driver and the semiconductor memory are provided with a first insulation gate type of an electric field transistor and a second insulation gate type of an electric field transistor. The first insulation gate type of an electric field transistor is connected between a first node and a word line and sends a voltage on the first node onto the word line when it is turned on. The second insulation gate type of an electric field transistor is connected between a second node and the word line and sends a voltage on the second node onto the word line when it is turned on. Moreover, this contains a unit for sending a predetermined voltage to the second node, and further generating a signal to control an operation for turning on and off the first and second insulation gate electric field transistors, based on an address signal. In the unit, a resistance between a source and a drain, when the second insulation gate type of the electric field transistor is turned off, is smaller than a resistance between a source and a drain, when the first insulation gate type of the electric field transistor is turned off.

Japanese Laid Open Patent Application (JP-A-Heisei, 11-288587) discloses the following semiconductor integrated circuit device. The semiconductor integrated circuit device is a non-selection negative word line manner of a semiconductor integrated circuit device for converting the low potential level on a word line amplification into a negative voltage lower than a standard voltage. This is characterized in that it contains a mat controller for controlling a reset timing of the word line in a memory mat configured by virtually dividing a memory cell array, and then delaying the reset timing of the word line when the plurality of word lines are selected.

SUMMARY OF THE INVENTION

Therefore, an object of the present invention is to provide a semiconductor memory that enables a high-speed operation.

Another object of the present invention is to provide a semiconductor memory that is not necessary to consider the variation of memory cells.

Still another object of the present invention is to provide a semiconductor memory that does not have the delay circuits which is used for word reset operation.

Yet still another object of the present invention is to provide a semiconductor memory that to enable reduce the current used in the memory, and to decrease an electric power consumption.

It is also an object to provide a semiconductor memory manufactured at a low cost by reducing the elements in the semiconductor memory.

In order to achieve an aspect of the present invention, the present invention provides a semiconductor memory including a block selection circuit, a redundancy main word decoder, a word reset circuit and a word driver circuit. The block selection circuit outputs a block selection signal based on an address signal. The redundancy main word decoder generates a redundancy main word signal in response to the block selection signal. The word reset circuit outputs a word reset signal in response to the redundancy main word signal. The word driver circuit which drives one of word lines in response to the word reset signal, a main word signal indicating selection of the word driver circuit, and a word decode signal indicating selection of the one of word lines.

In the semiconductor memory, the redundancy main word decoder generates the redundancy main word signal in response to a redundancy main word control signal indicating a request for generating the redundancy main word signal, in addition to the block selection signal.

The semiconductor memory of the present invention further includes a main word decoder and a word decoder. The main word decoder generates the main word signal based on the address signal and the block selection signal. The word decoder outputs the word decode signal based on the address signal and the block selection signal.

In the semiconductor memory, the word reset circuit is composed of one stage of an inverter or odd number of inverters.

In the semiconductor memory, the word driver circuit includes a first transistor to an eighth transistor. The first transistor has a source connected to the word decoder, a gate connected to a drain of a second transistor, and a drain connected to one of the word lines. The second transistor has a source connected to the main word decoder, a gate connected to a high potential level power supply, and the drain connected to the gate of the first transistor. The third transistor has a source connected to a low potential level power supply, a gate connected to a first pull-down signal line, and a drain connected to the one of the word lines. The fourth transistor has a source connected to the first pull-down signal line, a gate connected to the word reset circuit, and a drain connected to a high potential level power supply. The fifth transistor has a source connected to a low potential level power supply, a gate connected to the main word decoder, and a drain connected to the first pull-down signal line. The sixth transistor has a source connected to the word decoder, a gate connected to a drain of the seventh transistor, and a drain connected to another one of the word lines. The seventh transistor has a source connected to the main word decoder, a gate connected to a high potential level power supply, and the drain connected to the gate of the sixth transistor. The eighth transistor has a source connected to a low potential level power supply, a gate connected to the first pull-down signal line, and a drain connected to the another one of the word lines.

In the semiconductor memory, a transistor size of the fifth transistor is smaller than that of the fourth transistor.

In the semiconductor memory, a carrier mobility of the fifth transistor is smaller than that of the fourth transistor.

In the semiconductor memory, the main word signal and the redundancy main word signal become the high potential level or the low potential level at the substantially same time.

The semiconductor memory further includes a redundancy word decoder and a redundancy word driver circuit. The redundancy word decoder outputs a redundancy word decode signal based on the block selection signal and a redundancy word selection signal indicating selection of the redundancy word decoder. The redundancy word driver circuit drives one of redundancy word lines in response to the word reset signal, the redundancy main word signal and the redundancy word decode signal.

In the semiconductor memory, the word reset circuit includes one stage of an inverter or odd number of inverters.

In the semiconductor memory, the redundancy word driver circuit includes a ninth transistor to an eighth transistor. The ninth transistor has a source connected to the redundancy word decoder, a gate connected to a drain of a tenth transistor, and a drain connected to one of the redundancy word lines. The tenth transistor has a source connected to the redundancy main word decoder, a gate connected to a high potential level power supply, and the drain connected to the gate of the ninth transistor. The eleventh transistor has a source connected to a low potential level power supply, a gate connected to a second pull-down signal line, and a drain connected to the one of the redundancy word lines. The twelfth transistor has a source connected to the second pull-down signal line, a gate connected to the word reset circuit, and a drain connected to a high potential level power supply. The thirteenth transistor has a source connected to a low potential level power supply, a gate connected to the redundancy main word decoder, and a drain connected to the second pull-down signal line. The fourteenth transistor has a source connected to the redundancy word decoder, a gate connected to a drain of a fifteenth transistor, and a drain connected to another one of the redundancy word lines. The fifteenth transistor has a source connected to the redundancy main word decoder, a gate connected to a high potential level power supply, and the drain connected to the gate of the fourteenth transistor. The sixteenth transistor has a source connected to a low potential level power supply, a gate connected to the second pull-down signal line, and a drain connected to the another one of the redundancy word lines.

In the semiconductor memory, a transistor size of the thirteenth transistor is smaller than that of the twelfth transistor.

In the semiconductor memory, the main word signal and the redundancy main word signal become the high potential level or the low potential level at the substantially same time.

In order to achieve another aspect of the present invention, the present invention provides a semiconductor memory including a block selection circuit,a main word decoder, a word reset circuit, a word driver circuit and a word driver circuit. The block selection circuit outputs a block selection signal based on an address signal. The main word decoder generates a main word signal based on the address signal and the block selection signal. The word reset circuit outputs a word reset signal in response to the main word signal. The word driver circuit drives one of word lines in response to the word reset signal, the main word signal and a word decode signal.

The semiconductor memory of the present invention further includes a word decoder outputting the word decode signal based on the address signal and the block selection signal.

In the semiconductor memory, the word reset circuit includes one stage of an inverter or odd number of inverters.

In the semiconductor memory, the word driver circuit includes a first transistor to eighth transistor. The first transistor has a source connected to the word decoder, a gate connected to a drain of a second transistor, and a drain connected to one of the word lines. The second transistor has a source connected to the main word decoder, a gate connected to a high potential level power supply, and the drain connected to the gate of the first transistor. The third transistor has a source connected to a low potential level power supply, a gate connected to a first pull-down signal line, and a drain connected to the one of the word lines. The fourth transistor has a source connected to the first pull-down signal line, a gate connected to the word reset circuit, and a drain connected to a high potential level power supply. The fifth transistor has a source connected to a low potential level power supply, a gate connected to the main word decoder, and a drain connected to the first pull-down signal line. The sixth transistor has a source connected to the word decoder, a gate connected to a drain of a seventh transistor, and a drain connected to another one of the word lines. The seventh transistor has a source connected to the main word decoder, a gate connected to a high potential level power supply, and the drain connected to the gate of the sixth transistor. The eighth transistor having a source connected to a low potential level power supply, a gate connected to the first pull-down signal line, and a drain connected to the another one of the word lines.

In the semiconductor memory, a transistor size of the fifth transistor is smaller than that of the fourth transistor.

The semiconductor memory of the present invention, further includes a redundancy main word decoder, a redundancy word decoder, a redundancy word reset circuit, a redundancy word driver circuit. The redundancy main word decoder generates a redundancy main word signal based on the block selection signal and a redundancy main word control signal indicating a request for generating the redundancy main word signal. The redundancy word decoder outputs a redundancy word decode signal based on the block selection signal and a redundancy word selection signal. The redundancy word reset circuit outputs a redundancy word reset signal in response to the redundancy main word signal. The redundancy word driver circuit drives one of redundancy word lines in response to the redundancy word reset signal, the redundancy main word signal and the redundancy word decode signal.

In the semiconductor memory, the redundancy word reset circuit includes one stage of an inverter or odd number of inverters.

In the semiconductor memory, the redundancy word driver circuit includes a ninth transistor to a sixteenth transistor. The first transistor has a source connected to the redundancy word decoder, a gate connected to a drain of a tenth transistor, and a drain connected to one of the redundancy word lines. The tenth transistor has a source connected to the redundancy main word decoder, a gate connected to a high potential level power supply, and the drain connected to the gate of the ninth transistor. The eleventh transistor has a source connected to a low potential level power supply, a gate connected to a second pull-down signal line, and a drain connected to the one of the redundancy word lines. The twelfth transistor has a source connected to the second pull-down signal line, a gate connected to the word redundancy reset circuit, and a drain connected to a high potential level power supply. The thirteenth transistor has a source connected to a low potential level power supply, a gate connected to the redundancy main word decoder, and a drain connected to the second pull-down signal line. The fourteenth transistor has a source connected to the redundancy word decoder, a gate connected to a drain of a fifteenth transistor, and a drain connected to another one of the redundancy word lines. The fifteenth transistor has a source connected to the redundancy main word decoder, a gate connected to a high potential level power supply, and the drain connected to the gate of the fourteenth transistor. The sixteenth transistor has a source connected to a low potential level power supply, a gate connected to the second pull-down signal line, and a drain connected to the another one of the redundancy word lines.

In the semiconductor memory, a transistor size of the thirteenth transistor is smaller than that of the twelfth transistor.

In the semiconductor memory, the word driver circuit includes a seventeenth transistor to twenty-sixth transistor. The seventeenth transistor has a source connected to the word decoder, a gate connected to a drain of a eighteenth transistor, and a drain connected to one of the word lines. The eighteenth transistor has a source connected to the main word decoder, a gate connected to a high potential level power supply, and the drain connected to the gate of the seventeenth transistor. The nineteenth transistor has a source connected to a low potential level power supply, a gate connected to a source of a twentieth transistor, and a drain connected to the one of the word lines. The twentieth transistor has the source connected to the gate of the nineteenth transistor, a gate connected to the word reset circuit, and a drain connected to a high potential level power supply. The twenty-first transistor has a source connected to a low potential level power supply, a gate connected to the main word decoder, and a drain connected to the source of the twentieth transistor. The twenty-second transistor has a source connected to the word decoder, a gate connected to a drain of a twenty-third transistor, and a drain connected to another one of the word lines. The twenty-third transistor has a source connected to the main word decoder, a gate connected to a high potential level power supply, and the drain connected to the gate of the twenty-second transistor. The twenty-fourth transistor has a source connected to a low potential level power supply, a gate connected to a source of a twenty-fifth transistor, and a drain connected to the another one of the word lines. The twenty-fifth transistor has the source connected to the gate of the twenty-fourth transistor, a gate connected to the word reset circuit, and a drain connected to a high potential level power supply. The twenty-sixth transistor has a source connected to a low potential level power supply, a gate connected to the main word decoder, and a drain connected to the source of the twenty-fifth transistor.

In the semiconductor memory, the redundancy word driver circuit includes a twenty-seventh transistor to thirty-sixth transistor. The twenty-seventh transistor has a source connected to the redundancy word decoder, a gate connected to a drain of a twenty-eighth transistor, and a drain connected to one of the redundancy word lines. The twenty-eighth transistor has a source connected to the redundancy main word decoder, a gate connected to a high potential level power supply, and the drain connected to the gate of the twenty-seventh transistor. The twenty-ninth transistor has a source connected to a low potential level power supply, a gate connected to a source of a thirtieth transistor, and a drain connected to the one of the redundancy word lines. The thirtieth transistor has a source connected to the gate of the twenty-ninth transistor, a gate connected to the word reset circuit, and a drain connected to a high potential level power supply. The thirty-first transistor has a source connected to a low potential level power supply, a gate connected to the redundancy main word decoder, and a drain connected to the source of thirtieth transistor. The thirty-second transistor has a source connected to the redundancy word decoder, a gate-connected to a drain of a thirty-third transistor, and a drain connected to another one of the redundancy word lines. The thirty-third transistor has a source connected to the redundancy main word decoder, a gate connected to a high potential level power supply, and the drain connected to the gate of the thirty-second transistor. The thirty-fourth transistor has a source connected to a low potential level power supply, a gate connected to a source of a thirty-fifth transistor, and a drain connected to the another one of the redundancy word lines. The thirty-fifth transistor has a source connected to the gate of the thirty-fourth transistor, a gate connected to the word reset circuit, and a drain connected to a high potential level power supply. The thirty-sixth transistor having a source connected to a low potential level power supply, a gate connected to the redundancy main word decoder, and a drain connected to the source of thirty-fifth transistor.

In order to achieve still another aspect of the present invention, the present invention provides a method of driving a word line, including: (a) activating a block selection signal based on an address signal; (b) activating a redundancy main word signal in response to the block selection signal; (c) activating a word reset signal in response to the redundancy main word signal; and (d) activating a word line in response to a word reset signal, a main word signal, and a word decode signal.

In the method of driving a word line, the (b) activating the redundancy main word signal step includes (e) activating the redundancy main word signal in response to a redundancy main word control signal indicating a request for generating the redundancy main word signal, in addition to the block selection signal.

In the method of driving a word line, the (d) activating the word line step includes (f) activating the main word signal based on the address signal and the block selection signal; and (g) activating the word decode signal based on the address signal and the block selection signal.

The method of driving a word line further includes (h) inactivating the word line in response to the word decode signal; (i) inactivating the block selection signal based on the address signal; (j) inactivating a redundancy main word signal based on the block selection signal and redundancy main word control signal; and (k) inactivating a word reset signal in response to the redundancy main word signal.

DESCRIPTION OF THE PREFERRED EMBODIMENTS

Embodiments of a semiconductor memory according to the present invention will be described below with reference to the attached drawings.

(First Embodiment)

FIGS. 6 to 10 are views showing a first embodiment of a semiconductor memory according to the present invention.

Figure 6:
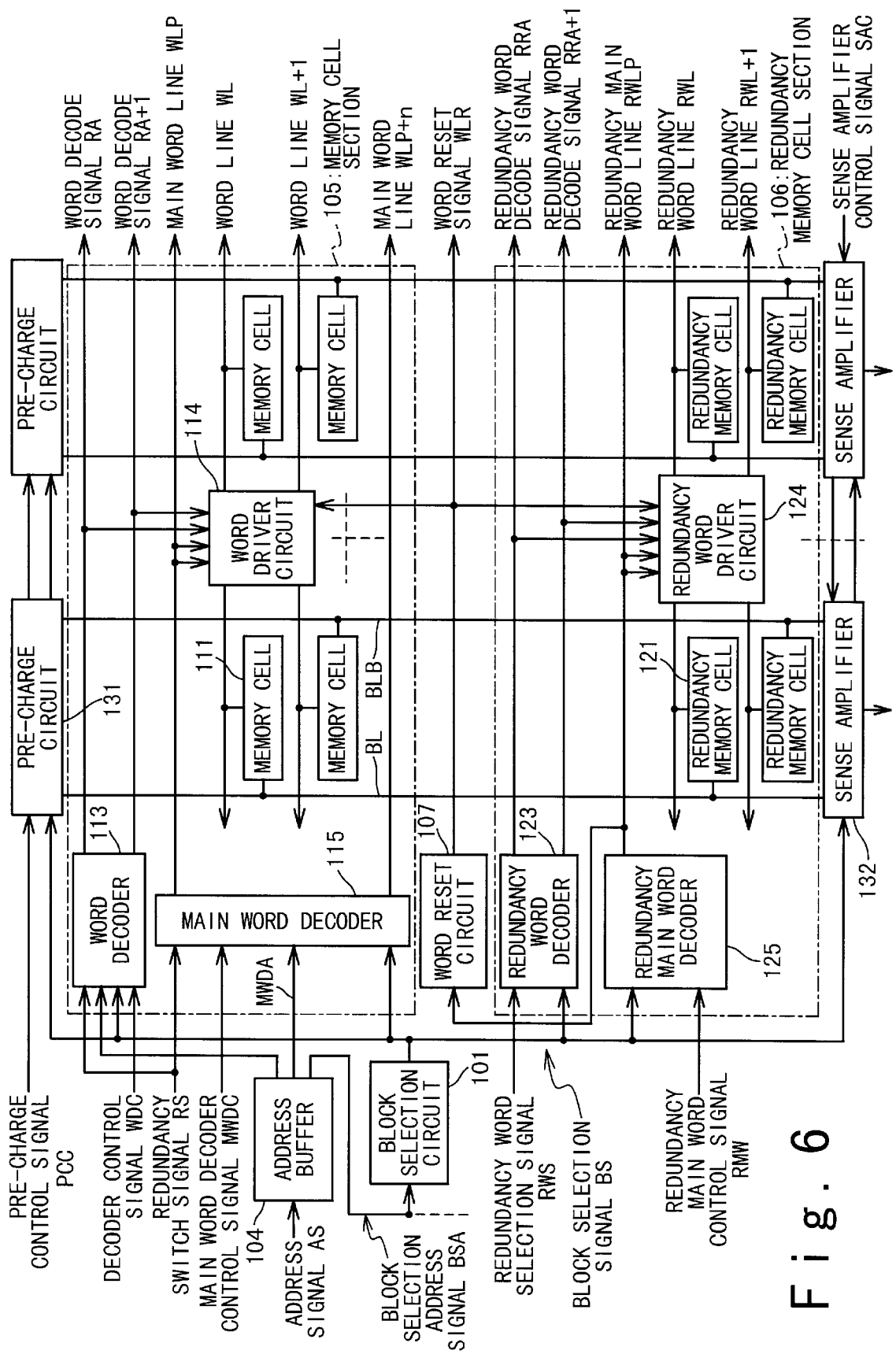
FIG. 6 is a block diagram showing the configurations of the first embodiment of the present invention.

FIG. 6 is a block diagram showing the configuration of the first embodiment of the present invention. As described below, this is the semiconductor memory including a block selection circuit 101, a memory cell section 105, a redundancy memory cell section 106, and a word reset circuit 107.

The block selection circuit 101 outputs a block selection signal BS based on an address signal AS.

The memory cell section 105 makes a predetermined memory cell 111 active based on a main word decoder address signal MWDA and the block selection signal BS. It includes memory cells 111, a word decoder 113, word driver circuits 114 and a main word decoder 115.

The memory cell 111 is the memory cell for storing one of the data. The word decoder 113 outputs word decode signals (only two signals RA, RA+1 are shown as the representation), based on a word decoder address signal and the block selection signal BS. The word driver 114 drives one of word lines (only two lines WL, WL+1 are shown as the representation) in order to make a predetermined memory cell 111 active, in response to a word reset signal WLR outputted by the word reset circuit 107, a main word signal outputted by the main word decoder 115, and the word decode signals (RA, RA+1). There is a plurality of word drivers 114. The main word decoder 115 generates the main word signal based on the main word decoder address signal MWDA and the block selection signal BS. The main word signal pulls up the potential level to high on the main word lines (only two lines WLP to WLP+1 are shown as the representation) to select a predetermined word driver 114 from the plurality of word drivers 114.

The redundancy memory cell section 106 makes a predetermined redundancy memory cell 121 active based on a redundancy word selection signal RWS and the block selection signal BS. It comprises redundancy memory cells 121, a redundancy word decoder 123, a redundancy word driver circuit 124 and a redundancy main word decoder 125.

The redundancy memory cell 121 is the memory cell for storing one of the data. The redundancy word decoder 123 outputs redundancy word decode signals (RRA, RRA+1) based on the block selection signal BS and a redundancy word selection signal RWS. The redundancy word driver 124 drives one of redundancy word lines (RWL, RWL+1) in order to make a predetermined memory cell 121 active, in response to the word reset signal WLR outputted by the word reset circuit 107, a redundancy main word signal outputted by the redundancy main word decoder 125, and the redundancy word decode signals (RRA, RRA+1). The redundancy main word decoder 125 generates the redundancy main word signal based on the block selection signal BS and a redundancy main word control signal RMW. The redundancy main word control signal RMW indicates a request to the redundancy main word decoder 125 for generating the redundancy main word signal. The redundancy main word signal pulls up the potential level to high on a redundancy main word line RWLP to select the redundancy word driver 124.

The potential level of the main word line WLP and the potential level of the redundancy main word line RWLP are controlled so as to be raised and lowered at the same timing from the output of the block selection signal BS.

Thus, the timing of selecting a word driver circuit 114 is the same as the timing of selecting a redundancy word driver circuit 124. It means that the word line WL is activated at the same timing as that the redundancy word line RWL is activated.

The word reset circuit 107 is composed of one stage of an inverter or odd number of inverters. In response to the output by the redundancy main word decoder 125 to the redundancy main word line RWLP, the word reset circuit 107 outputs the word reset signal WLR. The word reset signal WLR is inputted to the predetermined word driver 114 or the predetermined redundancy word driver 124.

The predetermined word driver 114 makes an pull-down transistors T103 (described later) off in response to the word reset signal WLR in order to prepare the input of the word decode signal (RA, RA+1). The redundancy word driver 124 also makes an pull-down transistors T113 (described later) off in response to the word reset signal WLR in order to prepare the input of the redundancy word decode signal (RRA, RRA+1).

Figure 7:
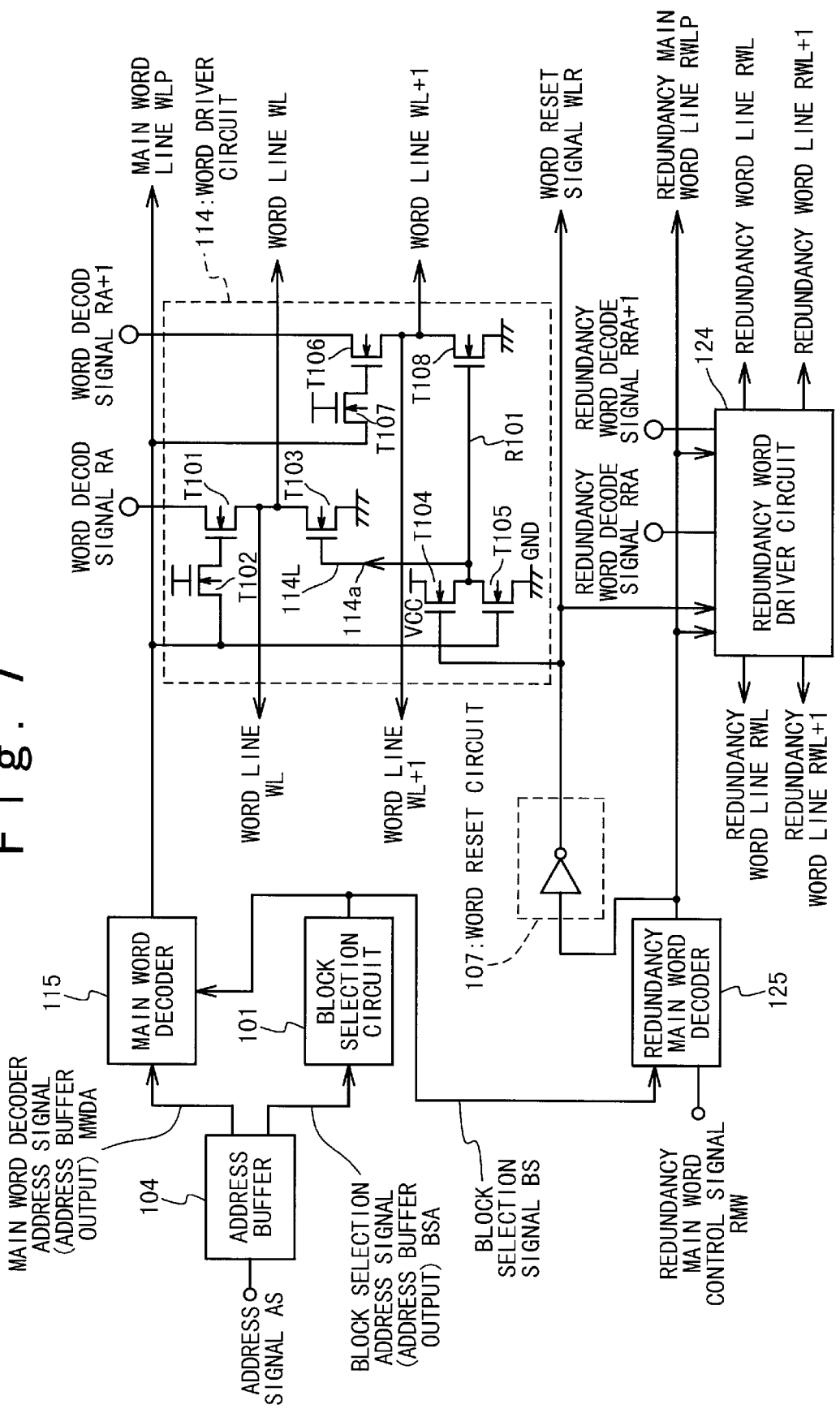
FIG. 7 is a circuit diagram showing a reset circuit and its word driver circuit of the first embodiment of the present invention.

FIG. 7 is a circuit diagram of the reset circuit and the word driver 114 in this embodiment. It is constituted by transistors T101 to T108, as described below.

The first transistor T101 has a source connected to the word decoder 113, a gate connected to the drain of the transistor T102, and a drain connected to the word lines WL. The transistor T101 makes the word line WL active, in response to the word decode signals RA.

The second transistor T102 has a source connected to the main word decoder 115, a gate connected to a high potential level power supply VCC, and a drain connected to the gate of the transistor T101.

The third transistor T103 has a source connected to a low potential level power supply GND, a gate connected to a pull-down signal line 114L for a pull-down signal 114a, and a drain connected to the word line WL. The transistor T103 makes the active word line WL inactive by using a pull-down signal 114a.

The fourth transistor T104 has a source connected to the pull-down signal line 114L, a gate connected to the word reset circuit 107, and a drain connected to a high potential level power supply VCC.

The fifth transistor T105 has a source connected to a low potential level power supply GND, a gate connected to the main word decoder 115, and a drain is connected to the pull-down signal line 114L. The transistor size of the fifth transistor T105 is formed so as to be smaller than the transistor size of the fourth transistor T104.

The sixth transistor T106 has a source connected to the word decoder 113, a gate connected to a drain of the seventh transistor T107, and a drain connected to the word lines WL+1. The transistor T106 makes the word line WL+1 active, in response to the word decode signals RA+1.

The seventh transistor T107 has a source connected to the main word decoder 115, a gate connected to a high potential level power supply VCC, and the drain connected to the gate of the sixth transistor T106.

The eighth transistor T108 has a source connected to a low potential level power supply GND, a gate connected to the pull-down signal line 114L, and a drain connected to the word line WL+1. The transistor T108 makes the active word line WL+1 inactive by using a pull-down signal 114a.

Figure 9:
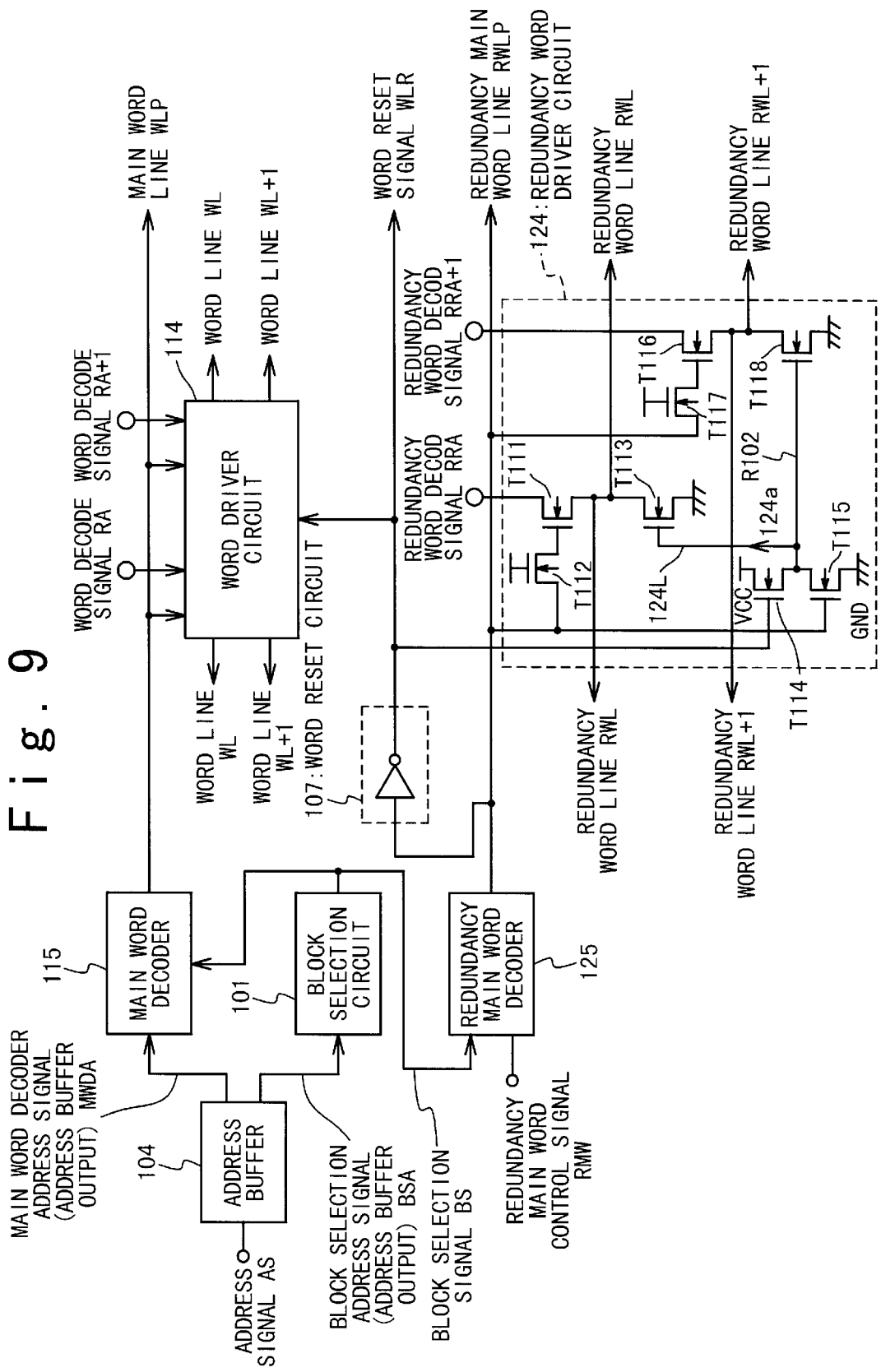
FIG. 9 is a circuit diagram showing the reset circuit and its redundancy word driver circuit of the first embodiment of the present invention.

FIG. 9 is a circuit diagram of the reset circuit and its redundancy word driver 124 in this embodiment. It is constituted by transistors T111 to T118, as described below.

The ninth transistor T111 has a source connected to the redundancy word decoder 123, a gate connected to the drain of the transistor T112, and a drain connected to the redundancy word line RWL. The transistor T111 makes the redundancy word line RWL active, in response to the redundancy word decode signals RRA.

The tenth transistor T112 has a source connected to the redundancy main word decoder 125, a gate connected to a high potential level power supply VCC, and a drain connected to the gate of the ninth transistor T111.

The eleventh transistor T113 has a source connected to a low potential level power supply GND, a gate connected to a pull-down signal line 124L for the pull-down signal 124a, and a drain connected to the redundancy word line RWL. The transistor T113 makes the active redundancy word line RWL inactive by using a pull-down signal 124a.

The twelfth transistor T114 has a source connected to the pull-down signal line 124L, a gate connected to the word reset circuit 107, and a drain connected to a high potential level power supply VCC.

The thirteenth transistor T115 has a source connected to a low potential level power supply GND, a gate connected to the redundancy main word decoder 125, and a drain connected to the pull-down signal line 124L. The transistor size of the thirteenth transistor T115 is formed so as to be smaller than the transistor size of the twelfth transistor T114.

The fourteenth transistor T116 has a source connected to the redundancy word decoder 125, a gate connected to a drain of the fifteenth transistor T117, and a drain connected to the redundancy word line RWL+1. The transistor T116 makes the redundancy word line RWL+1 active, in response to the redundancy word decode signals RRA+1.

The fifteenth transistor T117 has a source connected to the redundancy main word decoder 125, a gate connected to a high potential level power supply VCC, and the drain connected to the gate of the fourteenth transistor T116.

The sixteenth transistor T118 has a source connected to a low potential level power supply GND, a gate connected to the pull-down signal line 124L, and a drain connected to the redundancy word line RWL+1. The transistor T118 makes the active redundancy word line RWL+1 inactive by using a pull-down signal 124a.

In the present invention, the transistor size of transistor X is smaller than that of transistor Y means that the electric current flowing from the source to the drain of transistor X is smaller than that of transistor Y. For example, it is realized by using a transistor that has smaller ratio of the gate width W to the gate length L (W/L). The transistor that has thicker thickness of gate oxide film, and the transistor that has smaller electron mobility (n-type transistor) are also available.

In the case of selecting the redundancy memory cell 121, the main word decoder 115 and the word decoder 113 for the memory cell 111 are controlled so as to be switched to a non-selection state by using a redundancy switch signal RS.

Figure 8:
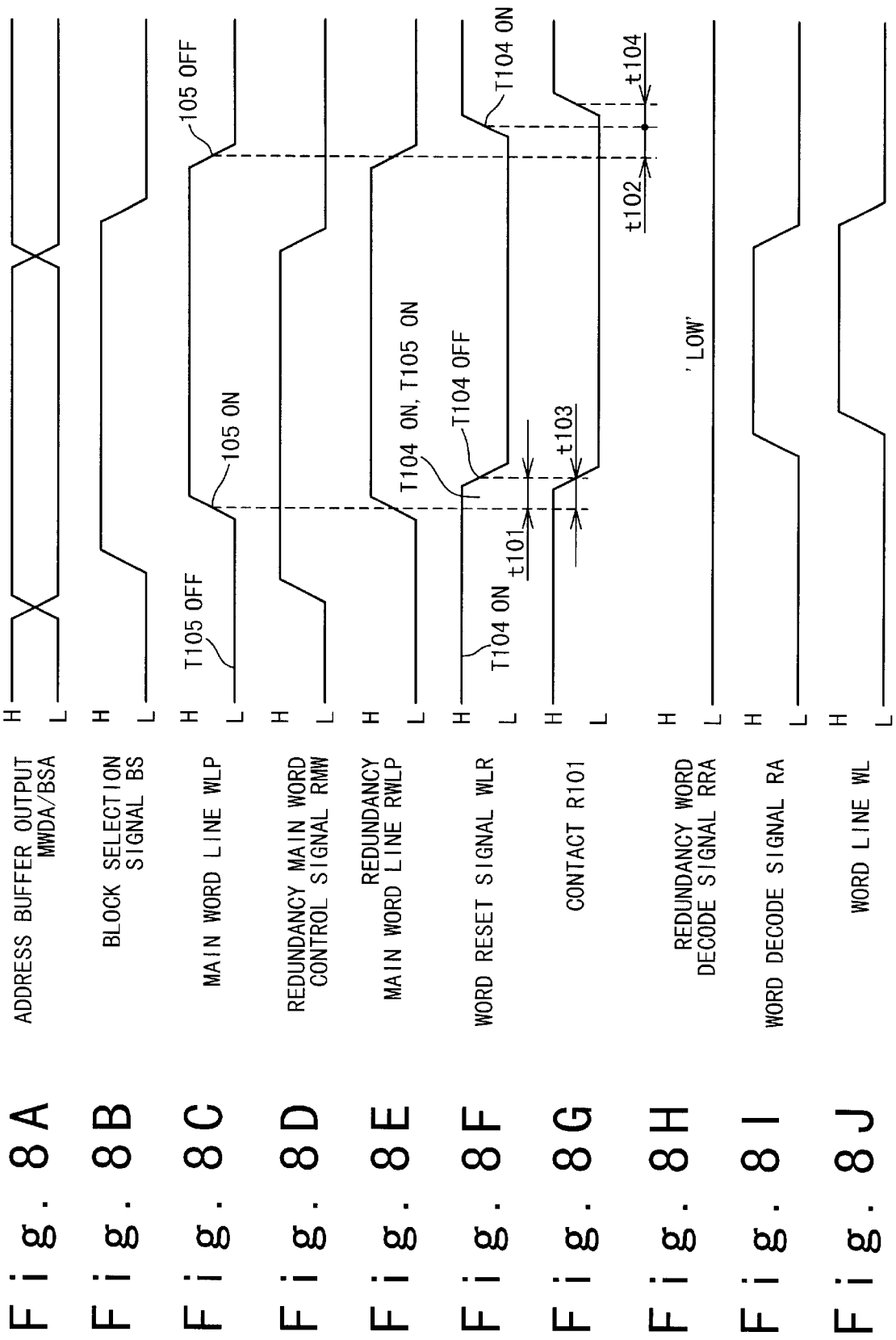
FIG. 8A is an operation timing chart of address buffer outputs of the first embodiment of the present invention.
FIG. 8B is an operation timing chart of a block selection signal of the first embodiment of the present invention.
FIG. 8C is an operation timing chart of the potential level of a main word line of the first embodiment of the present invention.
FIG. 8D is an operation timing chart of a redundancy main word control signal of the first embodiment of the present invention.
FIG. 8E is an operation timing chart of the potential level of a redundancy main word line of the first embodiment of the present invention.
FIG. 8F is an operation timing chart of a word reset signal of the first embodiment of the present invention.
FIG. 8G is an operation timing chart of the potential level of the contact R101 of the first embodiment of the present invention.
FIG. 8H is an operation timing chart of a redundancy word decode signal of the first embodiment of the present invention.
FIG. 8I is an operation timing chart of a word decode signal of the first embodiment of the present invention.
FIG. 8J is an operation timing chart of the potential level of a word line of the first embodiment of the present invention.

The operations of the first embodiment regarding the memory cell 111 will be described below in detail with reference to FIG. 8 showing the operation timing and FIG. 7 showing the circuit diagram of the reset circuit and it's the word driver circuit 114. Firstly, the case of selecting the memory cell Ill (not the redundancy memory cell 121) will be explained.

A block selection address signal BSA (FIG. 8A) is generated by the address buffer 104 from the address signal AS. In response to the block selection address signal BSA (FIG. 8A) from the address buffer 104, the block selection circuit 101 makes an block selection signal BS (FIG. 8B) the high potential level. That is, the block selection signal BS is activated based on an address signal AS.

A main word decoder address signal MWDA (FIG. 8A) is generated by the address buffer 104 from the address signal AS. Based on the block selection signal BS (FIG. 8B) and the main word decoder address signal MWDA (FIG. 8A) from the address buffer 104, the main word decoder 115 selects a predetermined word driver circuits 114 from a plurality of the word driver circuits 114. After that, the potential level of the selected main word line WLP (FIG. 8C) becomes high. That is, the main word signal on the main word line WLP is activated by the main word decoder 115 based on the address signal AS and the block selection signal BS.

At the time when the potential level of the selected main word line WLP (FIG. 8C) becomes high, the transistors T101, T106 and T105 of FIG. 7 are turned on.

At the substantially same timing when the potential level of the selected main word line WLP (FIG. 8C) becomes high, the potential level of a redundancy main word line RWLP (FIG. 8E) becomes high based on the block selection signal BS and a redundancy main word control signal RMW (FIG. 8D). Namely, the redundancy main word decoder 125 activates a redundancy main word signal on the redundancy main word line RWLP based on the block selection signal BS and a redundancy main word control signal RMW.

In this circuit, the potential level of the redundancy main word line RWLP (FIG. 8E) and the potential level of the main word line WLP (FIG. 8C) are adjusted so as to be raised and lowered at the substantially same timing. It helps to avoid operating troubles when the redundancy memory cell 121 is used. That is, a period until the main word decoder 115 receives the block selection signal BS (FIG. 8B) outputted by the block selection circuit 101 and then makes the potential level of the selected main word line WLP (FIG. 8C) high is equal to a period until the redundancy main word decoder 125 receives the block selection signal BS (FIG. 8B) outputted by the block selection circuit 101 and then makes the potential level of the selected redundancy main word line RWLP (FIG. 8E) high.

The redundancy memory cells 121 are prepared as spare memory cells for some broken memory cells of the memory cells 111. That is the reason why the potential level of the redundancy main word line RWLP (FIG. 8E) and the potential level of the main word line WLP (FIG. 8C) are adjusted so as to be raised and lowered at the substantially same timing.

Even if the redundancy memory cells 121 are not selected, the redundancy main word decoder 125 drives the redundancy main word line RWLP (FIG. 8E) at the substantially same timing as the main word decoder 115 drives the main word line WLP (FIG. 8C) the redundancy main word decoder 125 activates a redundancy main word signal on the redundancy main word line RWLP.

In response to the redundancy main word signal on the redundancy main word line RWLP (FIG. 8E), the word reset circuit 107 inverts the potential level of the redundancy main word signal. Then, the word reset circuit 107 outputs a delayed word reset signal WLR (FIG. 8F). That is, the word reset circuit 107 activates the word reset signal WLR in response to the redundancy main word signal.

The word reset signal WLR (FIG. 8F) becomes the low potential level after a time t111 after the redundancy main word line RWLP becomes the high potential level. Correspondingly to it, the transistor T104 is turned off. As a result, a contact R101 (FIG. 8G) of FIG. 7, which is connected to the source of transistor T104, the drain of the transistor T105, the gate of transistor T103 and the pull-down signal line 114L, becomes the low potential level. And then, the transistors T103 and T108 are turned off.

It takes time t103 from tuning on the transistor T105 to being the low potential level on contact R101 (FIG. 8G). It takes time t101 from turning on the transistor T105 to turning off the transistor T104 when the word reset signal WLR (FIG. 8F) becomes the low potential level.

The time difference between t103 and t101 comes from the difference between one stage of the transistor gate (T105) and one stage of the inverter (the word reset circuit 107) + a wiring load.

In the time t101, both of the transistors T104 and T105 are on at the same time. If a voltage difference between the transistors T104 and T105 exceeds a threshold voltage Vt of the transistor T105, a current flows through the transistors T104 and T105.

However, the transistor size of the transistor T105 is reduced to thereby drop the current through the transistor T105. For instance, the transistor T105, which has smaller ratio of the gate width W to the gate length L (W/L) than that of T104, is utilized. By using such transistor T105, the current, which flows through the transistors T104 and T105 until the transistor T104 is turned off, becomes less than the current in the case of not using such transistor T105.

At this time, the transistor T101 and the transistor T106 is on, and the transistor T103 and the transistor T108 is off. Thus, it's ready to receive a word decode signal RA (or RA+1).

A word decoder address signal is generated by the address buffer 104 based on the address signal AS. The word decode signal RA (FIG. 8I), outputted by the word decoder 113 based on the word decoder address signal and the block selection signal BS, becomes the high potential level. That is, the word decoder 113 activates the word decode signal based on the address signal and the block selection signal.

The word line WL (FIG. 8J) becomes the high potential level in response to the word decode signal RA. That is, the word line is activated based on the word reset signal, the main word signal, and the word decode signal. So, a desirable memory cell 111 is selected.

The example of FIG. 8 illustrates the case when the memory cell 111 is selected. Thus, the redundancy word decode signals RRA, RRA+1 (FIG. 8H) are kept the low potential level.

In order to set the word line WL (FIG. 8J) at the non-selection state, the word decode signal RA (FIG. 8I) is firstly made the low potential level, and the word line WL (FIG. 8J) is made the low potential level through the word driver 114.

In response to inactivating the block selection address signal BSA (FIG. 8A) from the address buffer 104, the block selection circuit 101 makes the block selection signal BS (FIG. 8B) the low potential level. That is, the block selection circuit 101 inactivates the block selection signal BS based on the address signal AS.

Based on the block selection signal BS, the main word decoder 115 makes the potential level of the main word line WLP (FIG. 8C) low. At the substantially same time, based on the block selection signal BS and the redundancy main word control signal RMW, the redundancy main word decoder 125 makes the potential level of the redundancy main word line RWLP (FIG. 8E) low. Namely, the redundancy main word signal is inactivated based on the block selection signal BS and the redundancy main word control signal RMW.

The transistors T101, T106 and T105 are turned off in conjunction with the fact that the potential level of the main word line WLP (FIG. 8C) becomes low. Also, in conjunction with the fact that the potential level of the redundancy main word line RWLP (FIG. 8E) becomes low, the word reset circuit 107 makes the word reset signal WLR (FIG. 8F) the high potential level after a time t102. That is, the word reset signal WLR is inactivated in response to the redundancy main word signal.

Thus, after the time t102, the transistor T104 is turned on. Then, after a time t104, the contact R101 (FIG. 8G) becomes the high potential level, and the transistors T103 and T108 are turned on. So, the word line WL (FIG. 8J) is kept the low potential level.

In this case, after the transistor T105 is turned off, the transistor T104 is then turned on. Thus, the current does not flow through the transistors T104 and T105.

Next, the case of selecting the redundancy memory cell 121 (not the memory cell 111) will be explained.

Figure 10:
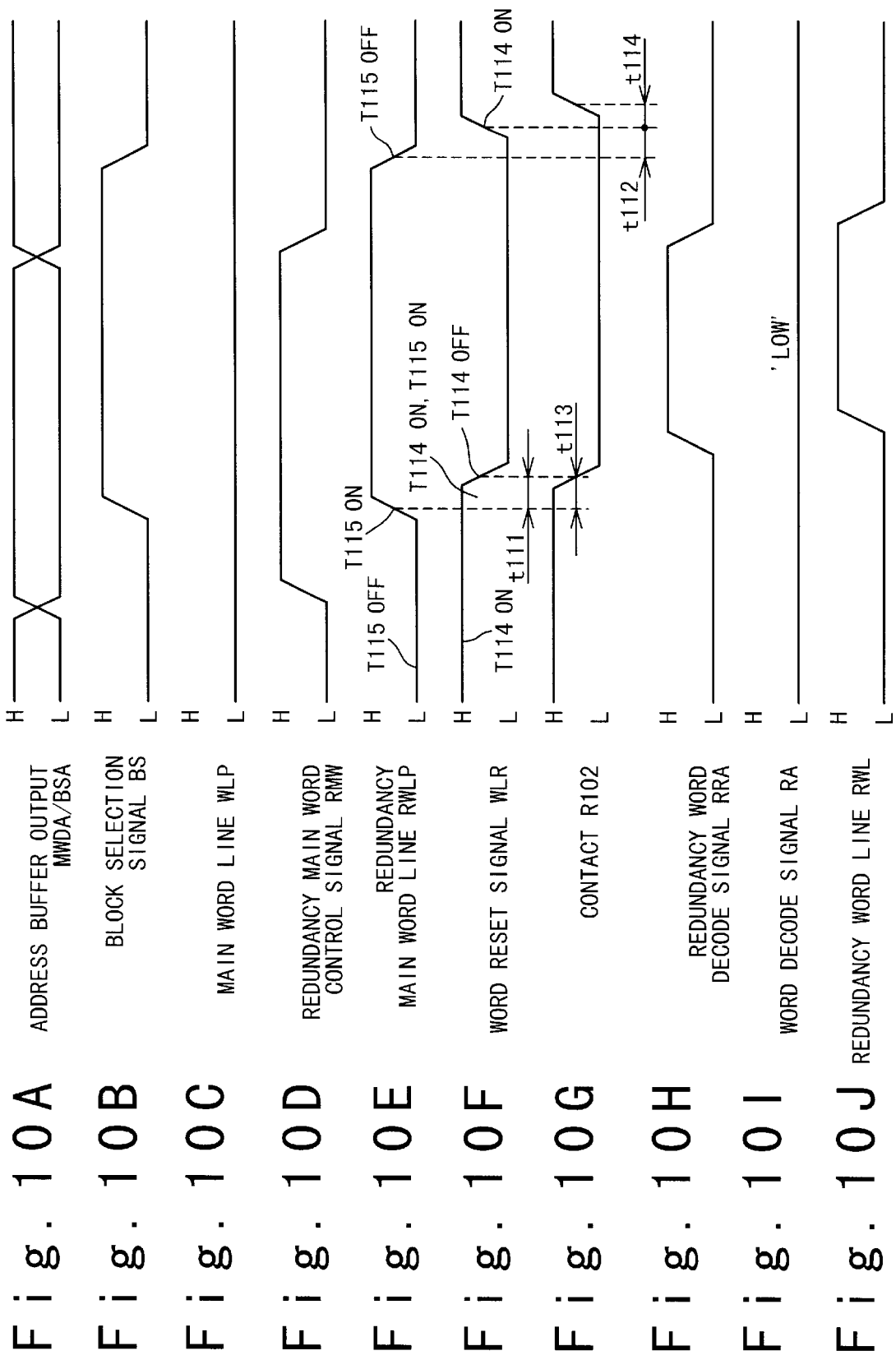
FIG. 10A is an operation timing chart of address buffer outputs of the first embodiment of the present invention.
FIG. 10B is an operation timing chart of a block selection signal of the first embodiment of the present invention.
FIG. 10C is an operation timing chart of the potential level of a main word line of the first embodiment of the present invention.
FIG. 10D is an operation timing chart of a redundancy main word control signal of the first embodiment of the present invention.
FIG. 10E is an operation timing chart of the potential level of a redundancy main word line of the first embodiment of the present invention.
FIG. 10F is an operation timing chart of a word reset signal of the first embodiment of the present invention.
FIG. 10G is an operation timing chart of the potential level of the contact R102 of the first embodiment of the present invention.
FIG. 10H is an operation timing chart of a redundancy word decode signal of the first embodiment of the present invention.
FIG. 10I is an operation timing chart of a word decode signal of the first embodiment of the present invention.
FIG. 10J is an operation timing chart of the potential level of a redundancy word line of the first embodiment of the present invention.

The operations of the first embodiment regarding the redundancy memory cell 121 will be described below in detail with reference to FIG. 10 showing the operation timing and FIG. 9 showing the circuit diagram of the reset circuit and it's the redundancy word driver circuit 124.

A block selection address signal BSA (FIG. 10A) is generated by the address buffer 104 from the address signal AS. In response to the block selection address signal BSA (FIG. 10A) from the address buffer 104, the block selection circuit 101 makes an block selection signal BS (FIG. 10B) the high potential level. That is, the block selection signal BS is activated based on an address signal AS.

Based on the block selection signal BS (FIG. 10B) and an redundancy main word control signal RMW (FIG. 10D), the redundancy main word decoder 125 selects a redundancy word driver circuits 124. After that, the potential level of the redundancy main word line WLP (FIG. 10E) becomes high. Namely, the redundancy main word decoder 125 activates a redundancy main word signal on the redundancy main word line RWLP based on the block selection signal BS and a redundancy main word control signal RMW. At this timing, the transistors T111, T116 and T115 of FIG. 9 are turned on.

In this circuit, the potential level of the redundancy main word line RWLP (FIG. 10E) and the potential level of the main word line WLP (FIG. 8C) are adjusted so as to be raised and lowered at the substantially same timing. It helps to avoid operating troubles when the redundancy memory cell 121 is used. However, in this case, the redundancy memory cell 121 is selected. Thus, the potential level of the main word line WLP (FIG. 10C) is kept low.

The redundancy memory cells 121 are prepared as spare memory cells for some broken memory cells of the memory cells 111. That is the reason why the potential level on the redundancy main word line RWLP (FIG. 10E) and the potential level of the main word line WLP (FIG. 8C) are adjusted so as to be raised and lowered at the substantially same timing.

In response to the redundancy main word signal on the redundancy main word line RWLP (FIG. 10E), the word reset circuit 107 inverts the potential level on the redundancy main word signal. Then, the word reset circuit 107 outputs a delayed word reset signal WLR (FIG. 10F). That is, the word reset circuit 107 activates the word reset signal WLR in response to the redundancy main word signal.

The word reset signal WLR (FIG. 10F) becomes the low potential level after a time till after the redundancy main word line RWLP (FIG. 10E) becomes the high potential level.

Correspondingly to it, the transistor T114 is turned off. As a result, a contact R102 (FIG. 10G) of FIG. 9, which is connected to the source of transistor T114, the drain of the transistor T115, the gate of transistor T113 and the pull-down signal line 124L, becomes the low potential level. And then, the transistors T113 and T118 are turned off.

It takes time t113 from tuning on the transistor T115 to being the low potential level on contact R102 (FIG. 10G). It takes time till from turning on the transistor T115 to turning off the transistor T114 when the word reset signal WLR (FIG. 10F) becomes the low potential level.

The time difference between t113 and t111 comes from the difference between one stage of the transistor gate (T115) and one stage of the inverter (the word reset circuit 107) + a wiring load.

In the time till, both of the transistors T114 and T115 are on at the same time. If a voltage difference between the transistors T114 and T115 exceeds a threshold voltage Vt of the transistor T115, a current flows through the transistors T114 and T115.

However, the transistor size of the transistor T115 is reduced to thereby drop the current through the transistor T115. For instance, the transistor T115, which has smaller ratio of the gate width W to the gate length L (W/L) than that of T114, is utilized. By using such transistor T115, the current, which flows through the transistors T114 and T115 until the transistor T114 is turned off, becomes less than the current in the case of not using such transistor T115.

At this time, the transistor T111 and the transistor T116 is on, and the transistor T113 and the transistor T118 is off. Thus, it's ready to receive a redundancy word decode signal RRA (or RA+1).

The redundancy word decode signal RRA (FIG. 10H) is outputted by the redundancy word decoder 123 based on the block selection signal BS and the redundancy word selection signal RWS. In response to the redundancy word decode signal RRA (FIG. 10H), the redundancy word line RWL (FIG. 10J) becomes the high potential level. So, a desirable redundancy memory cell 121 is selected.

The example of FIG. 10 illustrates the case when the redundancy memory cell 121 is selected. Thus, the word decode signals RA, RA+1 (FIG. 10I) are kept the low potential level.

In order to set the redundancy word line RWL (FIG. 10J) at the non-selection state, the redundancy word decode signal RRA (FIG. 10H) is firstly made the low potential level, and the redundancy word line RWL (FIG. 10J) is made the low potential level through the word driver 124.

In response to inactivating the block selection address signal BSA (FIG. 10A) from the address buffer 104, the block selection circuit 101 makes the block selection signal BS (FIG. 10B) the low potential level.

Based on the block selection signal BS, the redundancy main word decoder 125 make the potential level of the redundancy main word line RWLP (FIG. 10E) low.

The transistors T111, T116 and T115 are turned off in conjunction with the fact that the potential level of the redundancy main word line RWLP (FIG. 10E) becomes low. Also, in conjunction with the fact that the potential level of the redundancy main word line RWLP (FIG. 10E) becomes low, the word reset circuit 107 makes the word reset signal WLR (FIG. 10F) the high potential level after a time t112.

Thus, after the time t112, the transistor T114 is turned on. Then, after a time t114, the contact R102 (FIG. 10G) becomes the high potential level, and the transistors T113, T118 are turned on. So, the redundancy word line RWL (FIG. 10J) is kept the low potential level.

In this case, after the transistor T115 is turned off, the transistor T114 is then turned on. Thus, the current does not flow through the transistors T114 and T115.

(Second Embodiment)

FIGS. 11 to 15 are views showing a second embodiment of a semiconductor memory according to the present invention.

In the second embodiment of a semiconductor memory according to the present invention, the word reset circuit 207 is connected to the main word decoder 215. The input to the word reset circuit 207 comes from the output of the main word decoder 215 through the main word line WLP, instead of that of the redundancy main word decoder 225. Thus, the number of the word reset circuits 207 is equal to the main word lines WLP. Each word driver circuit 214 is controlled by each word reset circuit 207 formed for each word driver circuit 214.

For the redundancy word driver circuit 224, the redundancy word reset circuit 227 is formed separately from the word reset circuit 207. The input to the redundancy word reset circuit 227 comes from the output of the redundancy main word decoder 225 through the redundancy main word line RWLP.

Figure 11:
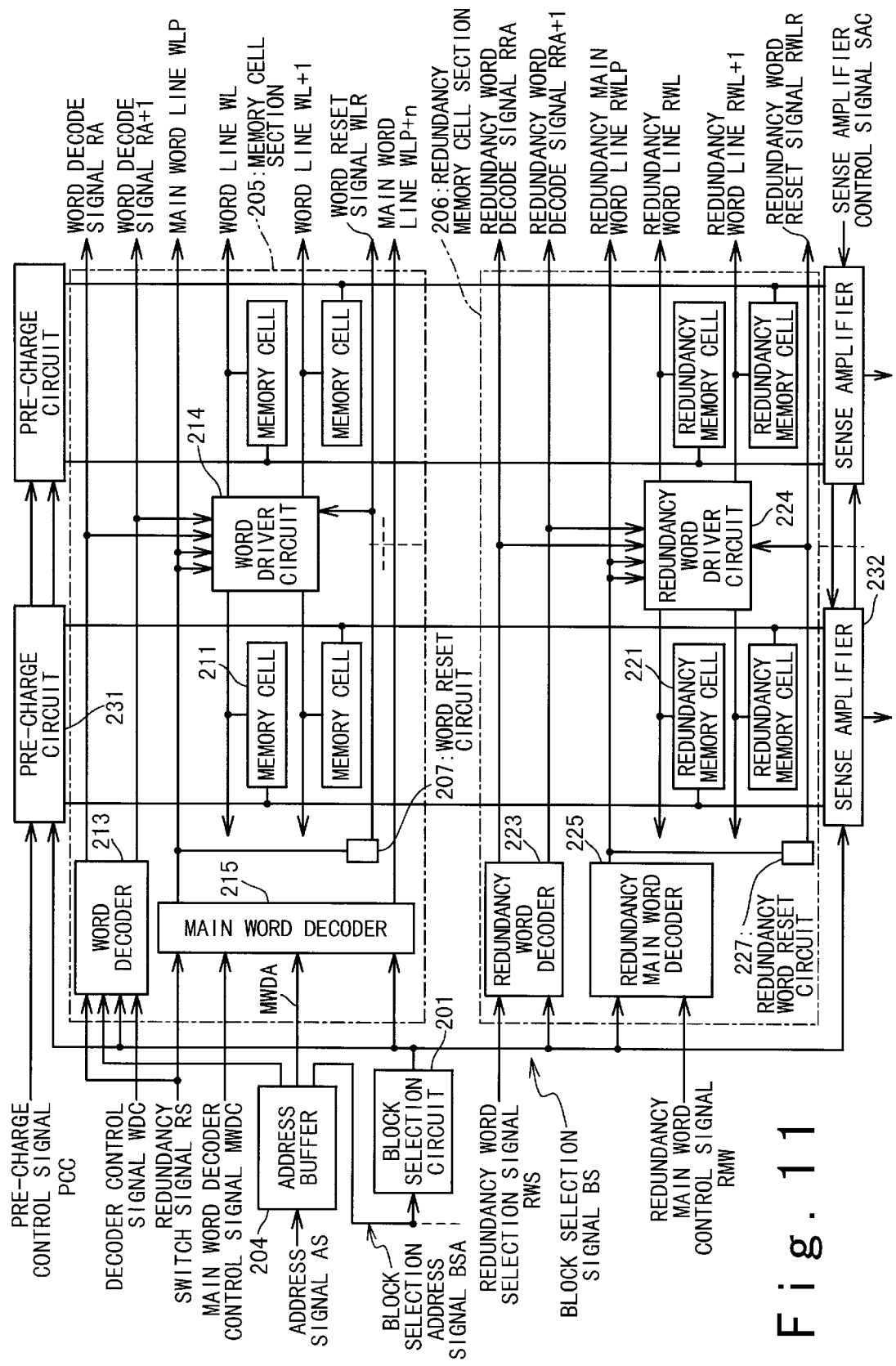
FIG. 11 is a block diagram showing the configurations of the second embodiment of the present invention.

FIG. 11 is a block diagram showing the configuration of the second embodiment of the present invention. As described below, this is the semiconductor memory including a block selection circuit 201, a memory cell section 205 and a redundancy memory cell section 206.

The block selection circuit 201 outputs a block selection signal BS based on an address signal AS. The memory cell section 205 makes a predetermined memory cell 211 active based on a main word decoder address signal MWDA and a block selection signal BS. It includes memory cells 211, a word decoder 213, word driver circuits 214 and a main word decoder 215, and word reset circuits 207.

The memory cell 211 is the memory cell for storing one of the data. The word decoder 213 outputs word decode signals (only two signals RA, RA+1 are shown as the representation), based on a word decoder address signal and the block selection signal BS. The word driver 214 drives one of word lines (only two lines WL, WL+1 are shown as the representation) in order to make a predetermined memory cell 211 active, in response to a word reset signal WLR outputted by the word reset circuit 207, a main word signal outputted by the main word decoder 215, and the word decode signals (RA, RA+1). There are a plurality of word drivers 214. The main word decoder 215 generating the main word signal based on the main word decoder address signal MWDA and the block selection signal BS. The main word signal pulls the potential level up to high on the main word lines (only two lines WLP to WLP+1 are shown as the representation) to select a predetermined word driver 214 from the plurality of word drivers 214. The word reset circuits 207 is composed of one stage of an inverter or odd number of inverters. Each word driver circuit 214 has its own word reset circuit 207. In response to the output by the main word decoder 215 to the main word line WLP, the word reset circuit 207 outputs the word reset signal WLR. The word reset signal WLR is inputted to the predetermined word driver 214.

The redundancy memory cell section 206 make a predetermined redundancy memory cell 221 active based on a redundancy word selection signal RWS and the block selection signal BS. It comprises redundancy memory cells 221, a redundancy word decoder 223, a redundancy word driver circuit 224, a redundancy main word decoder 225, and a redundancy word reset circuit 227.

The redundancy memory cell 221 is the memory cell for storing one of the data. The redundancy word decoder 223 outputs redundancy word decode signals (RRA, RRA+1) based on the block selection signal BS and a redundancy word selection signal RWS. The redundancy word driver 224 drives on of redundancy word lines (RWL, RWL+1) in order to make a predetermined memory cell 221 active, in response to a redundancy word reset signal RWLR outputted by the redundancy word reset circuit 227, a redundancy main word signal outputted by the redundancy main word decoder 225, and the redundancy word decode signals (RRA, RRA+1). The redundancy main word decoder 225 generates a redundancy main word signal based on the block selection signal BS and a redundancy main word control signal RMW. The redundancy main word control signal RMW indicates a request to the redundancy main word decoder 225 for generating the redundancy main word signal. The redundancy main word signal pulls the potential level up to high on a redundancy main word line RWLP to select the redundancy word driver 224. The redundancy word reset circuits 227 is composed of one stage of an inverter or odd number of inverters. The redundancy word driver circuit 224 has its own redundancy word reset circuit 227. In response to the output by the redundancy main word decoder 225 to the redundancy main word line RWLP, the redundancy word reset circuit 227 outputs the redundancy word reset signal RWLR. The redundancy word reset signal RWLR is inputted to the predetermined redundancy word driver 224.

The potential level of the main word line WLP and the potential level of the redundancy main word line RWLP are controlled so as to be raised and lowered at the same timing from the output of the block selection signal BS.

The predetermined word driver 214 makes an pull-down transistor T203 (described later) off in response to the word reset signal WLR in order to prepare the input of the word decode signal (RA, RA+1). The redundancy word driver 224 also makes an pull-down transistor T213 (described later) off in response to the redundancy word reset signal RWLR in order to prepare the input of the redundancy word decode signal (RRA, RRA+1).

Figure 12:
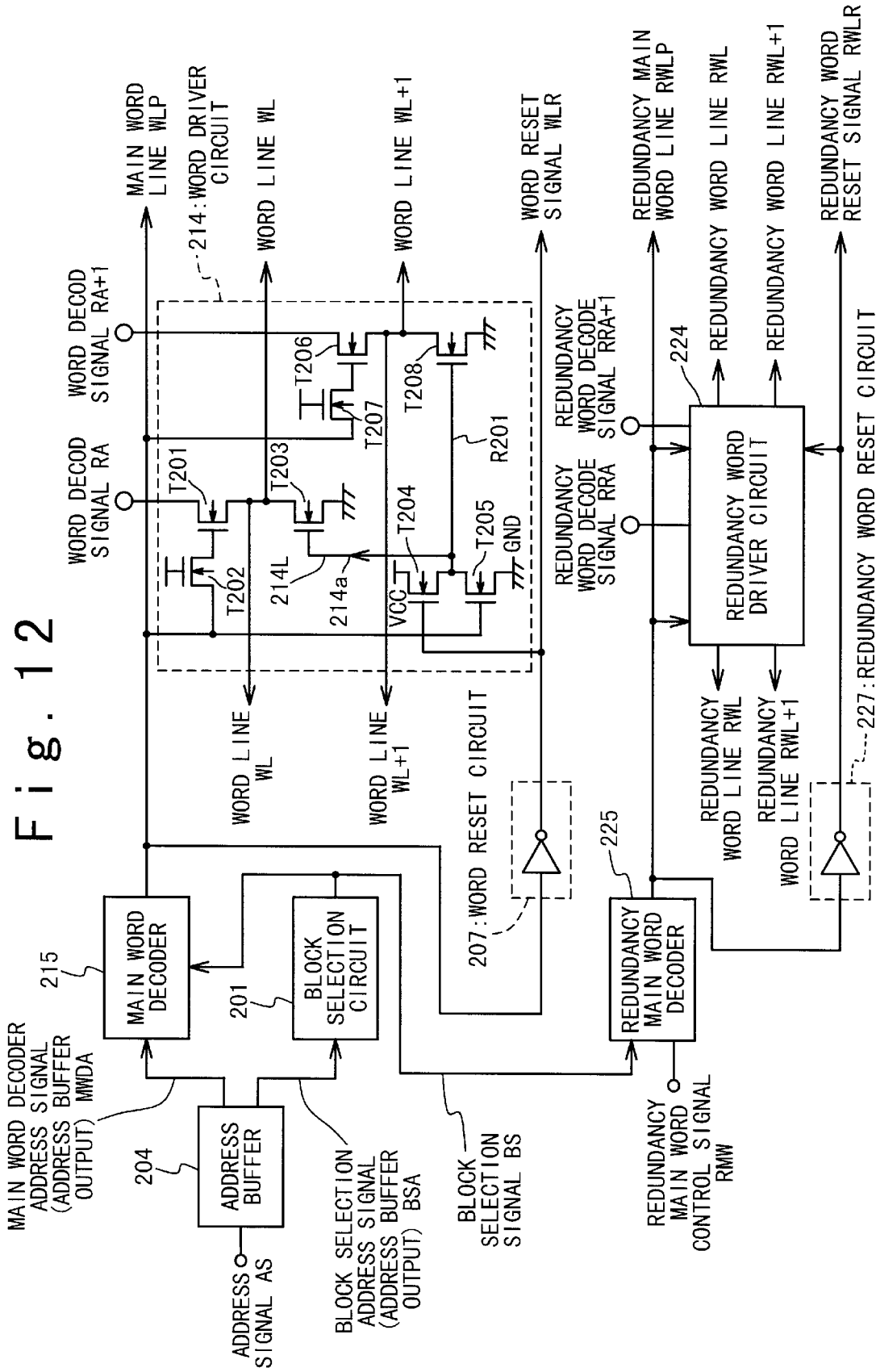
FIG. 12 is a circuit diagram showing a reset circuit and its word driver circuit of the second embodiment of the present invention.

FIG. 12 is a circuit diagram of the reset circuit and the word driver 214 in this embodiment. It is constituted by the transistors T201 to T208. Since the transistors T201 to T208 correspond to the transistors T101 to T108 in the first embodiment, respectively, the explanation for the transistors T201 to T208 is omitted.

Figure 14:
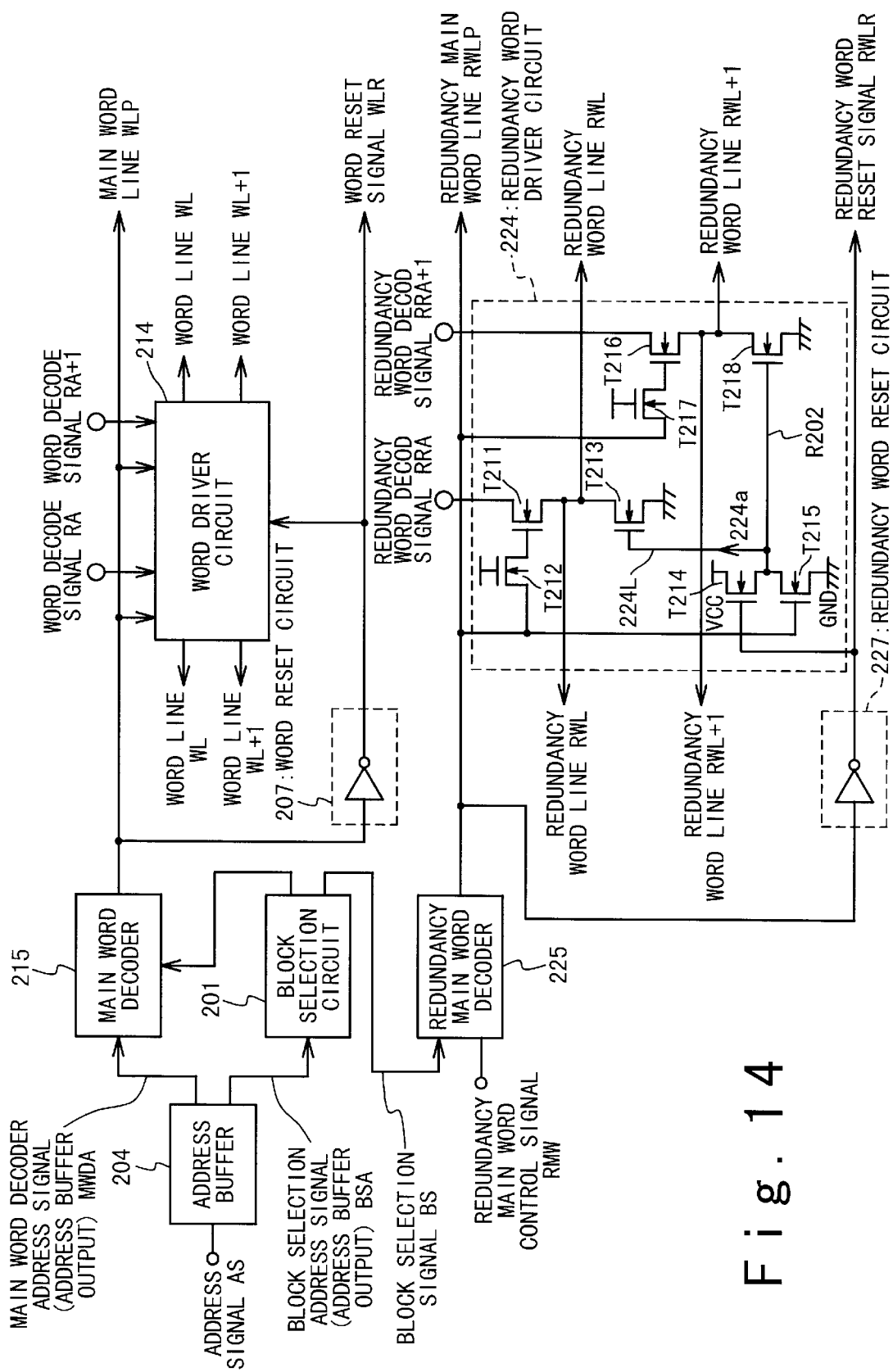
FIG. 14 is a circuit diagram showing a reset circuit and its redundancy word driver circuit of the second embodiment of the present invention.

FIG. 14 is a circuit diagram of the reset circuit and its redundancy word driver 224 in this embodiment. It is constituted by the transistors T211 to T218. Since the transistors T211 to T218 correspond to the transistors T111 to T118 in the first embodiment, respectively, the explanation for the transistors T211 to T218 is omitted.

In the case of selecting the redundancy memory cell 221, the main word decoder 215 and the word decoder 213 for the memory cell 211 are controlled so as to be switched to a non-selection state by using a redundancy switch signal RS.

Figure 13:
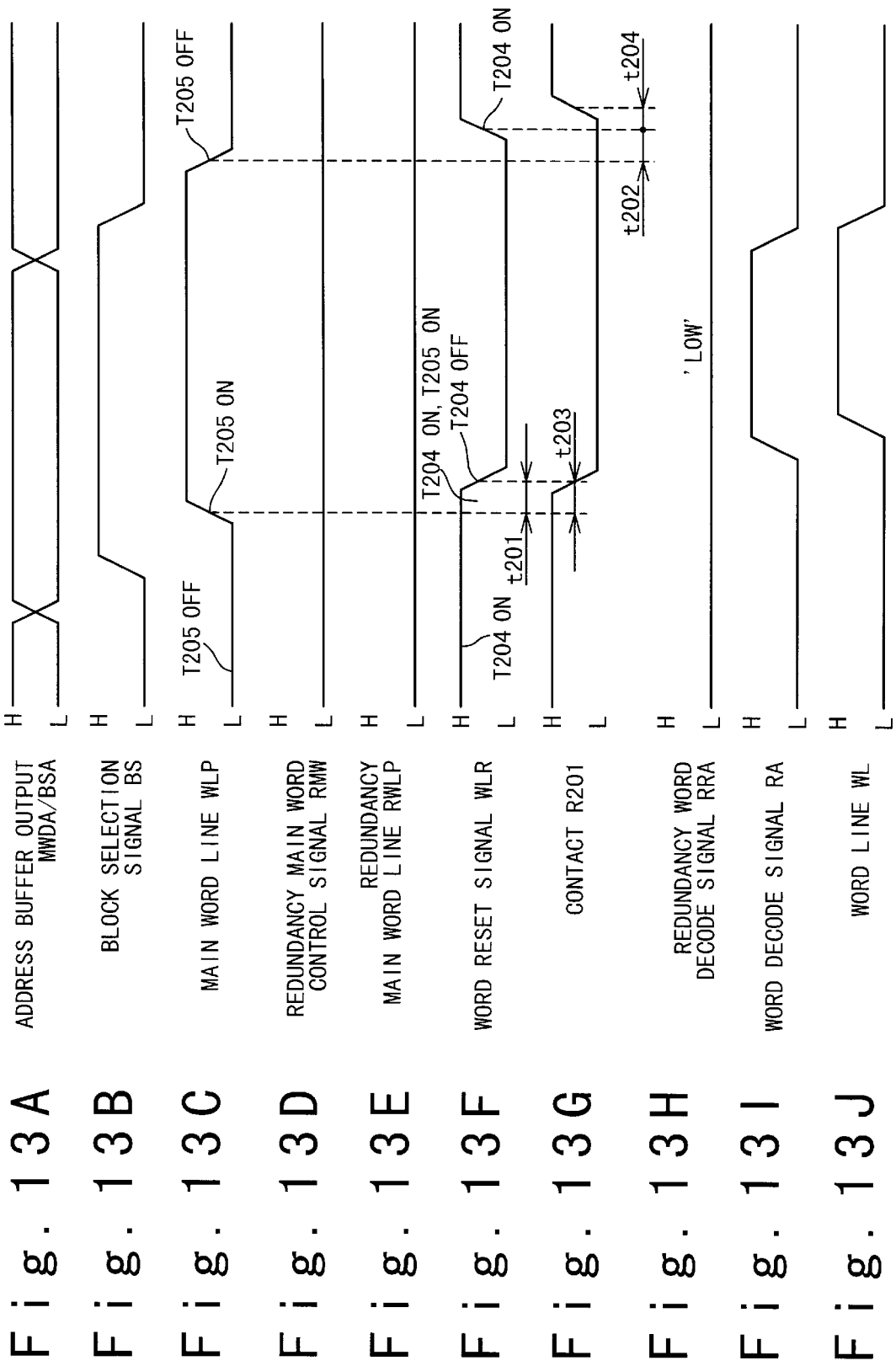
FIG. 13A is an operation timing chart of address buffer outputs of the second embodiment of the present invention.
FIG. 13B is an operation timing chart of a block selection signal of the second embodiment of the present invention.
FIG. 13C is an operation timing chart of the potential level of a main word line of the second embodiment of the present invention.
FIG. 13D is an operation timing chart of a redundancy main word control signal of the second embodiment of the present invention.
FIG. 13E is an operation timing chart of the potential level of a redundancy main word line of the second embodiment of the present invention.
FIG. 13F is an operation timing chart of a word reset signal of the second embodiment of the present invention.
FIG. 13G is an operation timing chart of the potential level of the contact R201 of the second embodiment of the present invention.
FIG. 13H is an operation timing chart of a redundancy word decode signal of the second embodiment of the present invention.
FIG. 13I is an operation timing chart of a word decode signal of the second embodiment of the present invention.
FIG. 13J is an operation timing chart of the potential level of a word line of the second embodiment of the present invention.

The operations of the second embodiment regarding the memory cell 211 will be described below in detail with reference to FIG. 13 showing the operation timing and FIG. 12 showing the circuit diagram of the reset circuit and it's the word driver circuit 214. Firstly, the case of selecting the memory cell 211 (not the redundancy memory cell 221) will be explained.

A block selection address signal BSA (FIG. 13A) is generated by the address buffer 204 from the address signal AS. In response to the block selection address signal BSA (FIG. 13A) from the address buffer 204, the block selection circuit 201 makes an block selection signal BS (FIG. 13B) the high potential level. That is, the block selection signal BS is activated based on an address signal AS.

Figure 1:
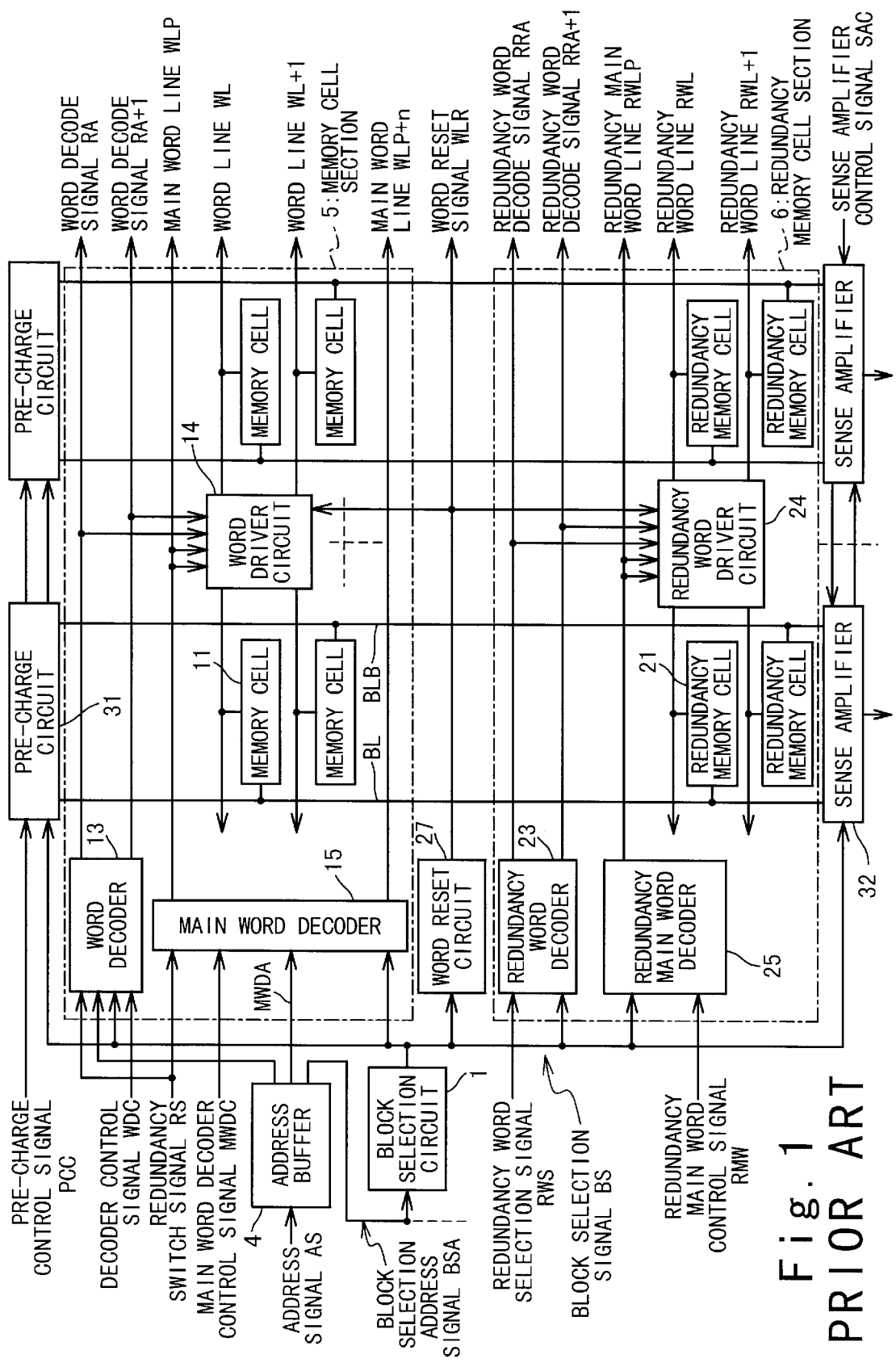
FIG. 1 is a block diagram showing a configuration of a conventional technique.
Figure 2:
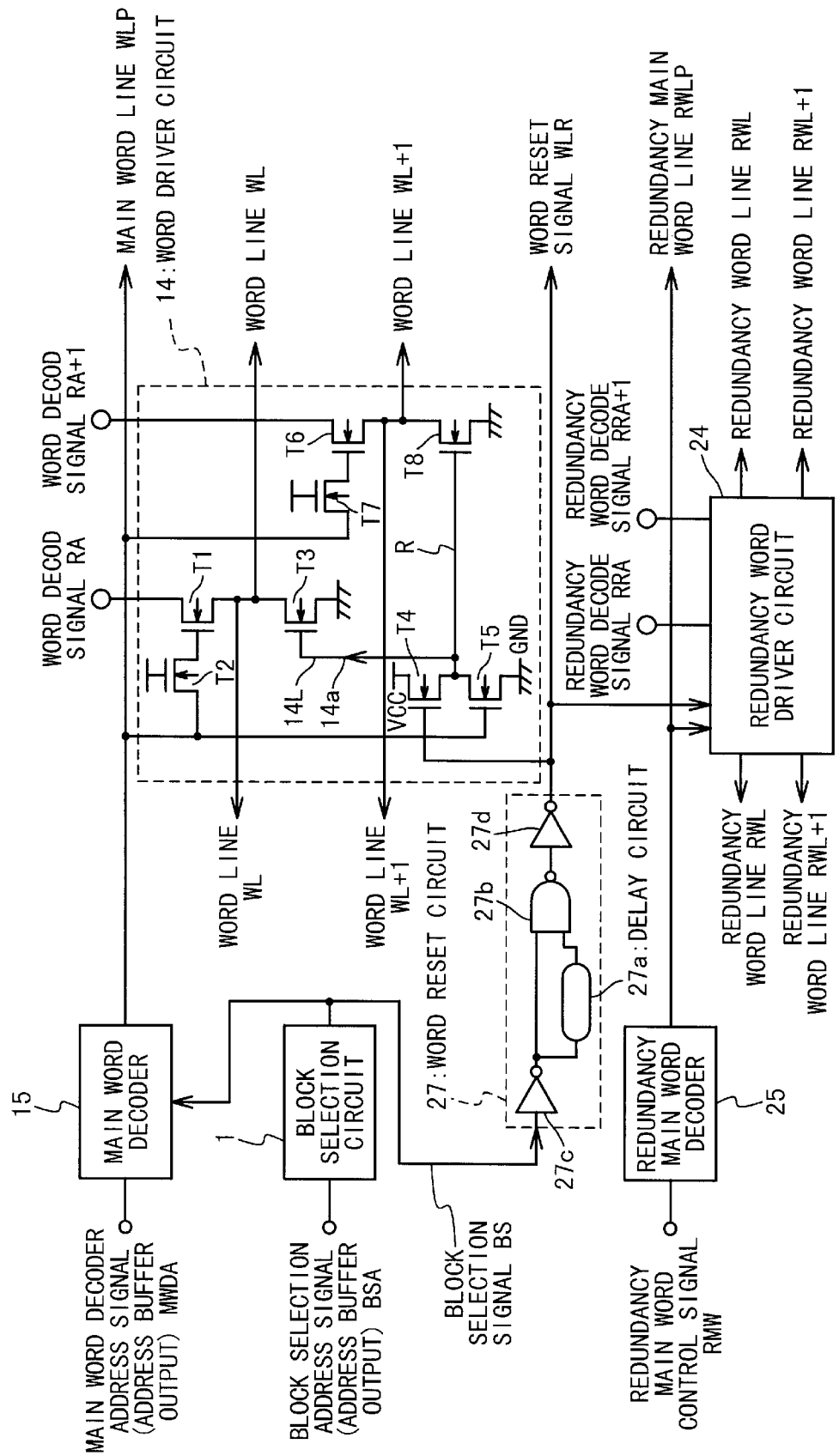
FIG. 2 is a circuit diagram showing a conventional reset circuit.
Figure 3:
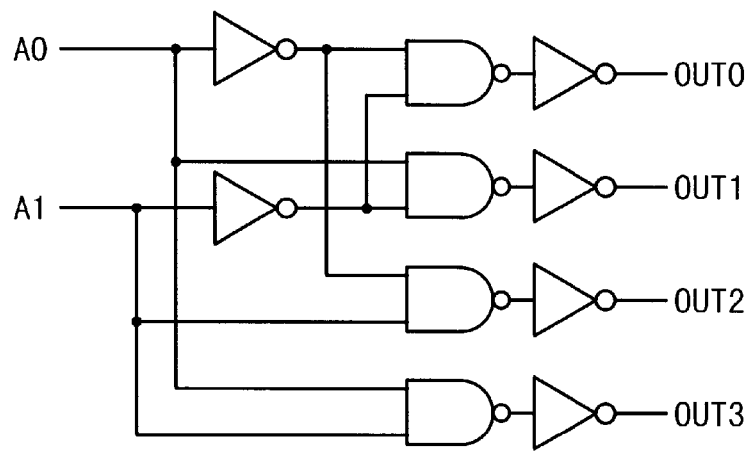
FIG. 3 is a view showing an example of a decoder circuit.
Figure 4:
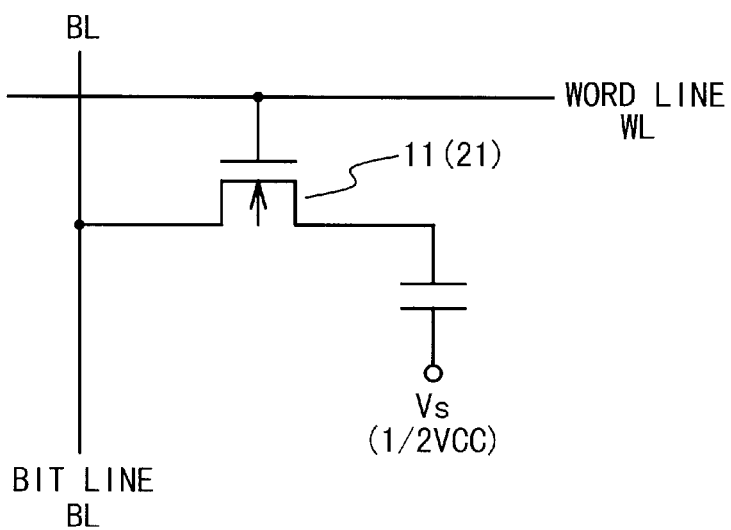
FIG. 4 is a view showing an example of a memory cell.
Figure 5:
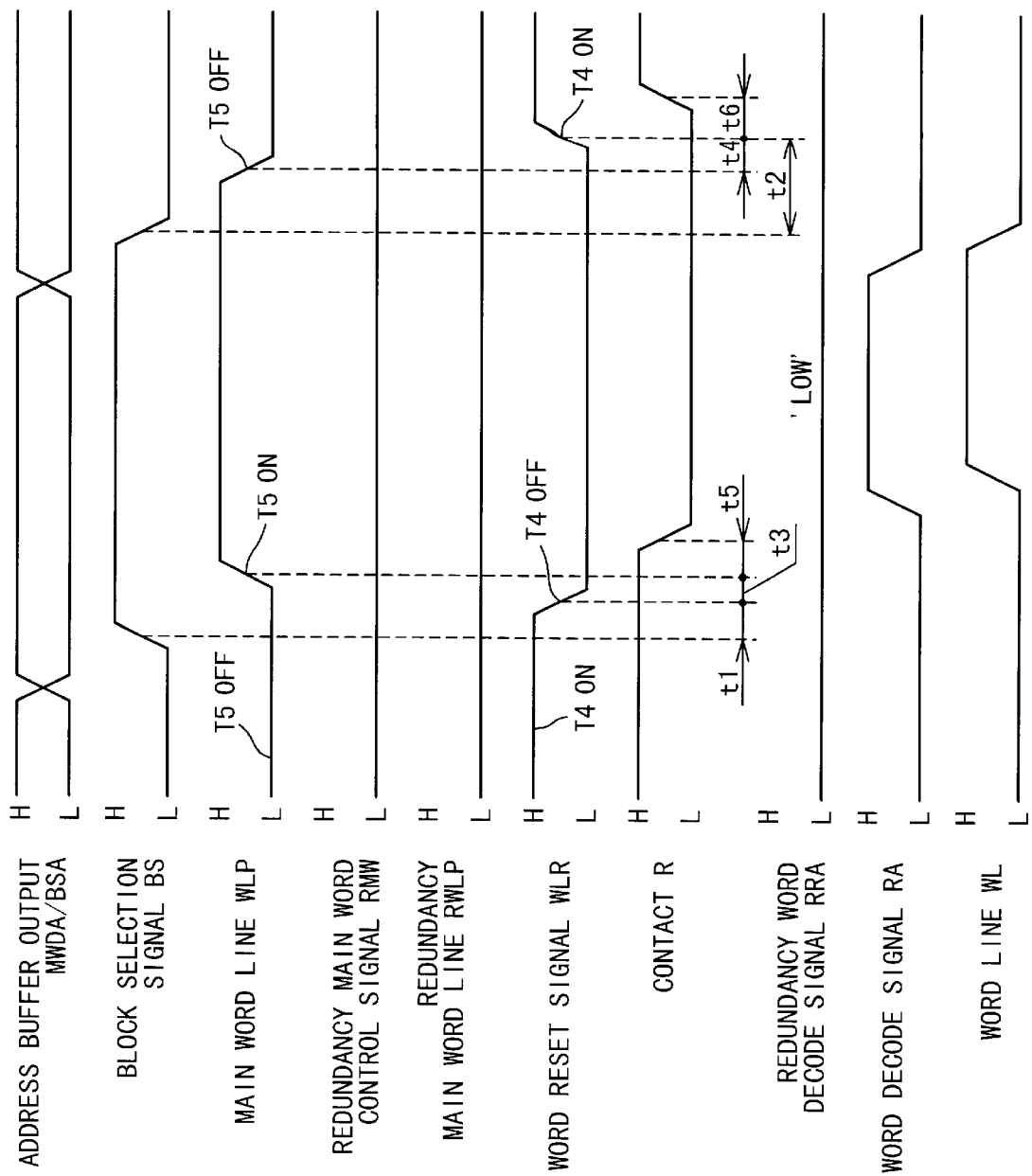
FIG. 5A is an operation timing chart of address buffer outputs of the conventional technique.
FIG. 5B is an operation timing chart of a block selection signal of the conventional technique.
FIG. 5C is an operation timing chart of the potential level of a main word line of the conventional technique.
FIG. 5D is an operation timing chart of a redundancy main word control signal of the conventional technique.
FIG. 5E is an operation timing chart of the potential level of a redundancy main word line of the conventional technique.
FIG. 5F is an operation timing chart of a word reset signal of the conventional technique.
FIG. 5G is an operation timing chart of the potential level of the contact R of the conventional technique.
FIG. 5H is an operation timing chart of a redundancy word decode signal of the conventional technique.
FIG. 5I is an operation timing chart of a word decode signal of the conventional technique.
FIG. 5J is an operation timing chart of the potential level of a word line of the conventional technique.

A main word decoder address signal MWDA (FIG. 13A) is generated by the address buffer 204 from the address signal AS. Based on the block selection signal BS (FIG. 3B) and the main word decoder address signal MWDA (FIG. 3A) from the address buffer 204, the main word decoder 215 selects a predetermined word driver circuits 214 from a plurality of the word driver circuits 214. After that, the potential level of the selected main word line WLP (FIG. 13C) becomes high. That is, the main word signal on the main word line WLP is activated by the main word decoder 215 based on the address signal AS and the block selection signal BS.

At the time when the potential level of the selected main word line WLP (FIG. 13C) becomes high, the transistors T201, T206 and T205 of FIG. 12 are turned on.

The output of the main word decoder 215 is utilized as the input to the word reset circuit 207. Thus, even if the output of the main word decoder 215 is the high potential level, the output of the redundancy main word decoder 225 do not have to be the high potential level.

In response to the main word signal on the main word line WLP (FIG. 13C), the word reset circuit 207 inverts the potential level of the main word signal. Then, the word reset circuit 207 outputs a delayed word reset signal WLR (FIG. 13F). That is, the word reset circuit 207 activates the word reset signal WLR in response to the main word signal.

The word reset signal WLR (FIG. 13F) becomes the low potential level after a time t201 after the main word line WLP becomes the high potential level. Correspondingly to it, the transistor T204 is turned off. As a result, a contact R201 (FIG. 13G) of FIG. 12, which is connected to the source of transistor T204, the drain of the transistor T205, the gate of transistor T203 and to the pull-down signal line 214L, becomes the low potential level. And then, the transistors T203, T208 are turned off.

It takes time t203 from tuning on the transistor T205 to being the low potential level on the contact R201 (FIG. 13G). It takes time t201 from turning on the transistor T205 to turning off the transistor T204 when the word reset signal WLR (FIG. 13F) becomes the low potential level.

The time difference between t203 and t201 comes from the difference between one stage of the transistor gate (T205) and one stage of the inverter (the word reset circuit 207) + a wiring load.

In the time t201, both of the transistor T204 and transistor T205 are on at the same time. If a voltage difference between the transistors T204 and T205 exceeds a threshold voltage Vt of the transistor T205, a current flows through the transistor T204 and T205.

However, the transistor size of the transistor T205 is reduced to thereby drop the current through the transistor T205. For instance, the transistor T205, which has smaller ratio of the gate width W to the gate length L (W/L) than that of T204, is utilized. By using the such transistor T205, the current, which flows through the transistors T204 and T205 until the transistor T204 is turned off, becomes less than the current in the case of not using such transistor T205.

At this time, the transistor T201 and the transistor T206 is on, and the transistor T203 and the transistor T208 is off. Thus, it's ready to receive a word decode signal RA (or RA+1).

A word decoder address signal is generated by the address buffer 204 based on the address signal AS. The word decode signal RA (FIG. 13I), outputted by the word decoder 213 based on the word decoder address signal and the block selection signal BS, becomes the high potential level.

That is, the word decoder 213 activates the word decode signal based on the address signal and the block selection signal.

The word line WL (FIG. 13J) becomes the high potential level in response to the word decode signal RA. That is, the word line is activated based on the word reset signal, the main word signal, and the word decode signal. So, a desirable memory cell 111 is selected. So, a desirable memory cell 211 is selected.

The example of FIG. 13 illustrates the case when the memory cell 211 is selected. Thus, the redundancy word decode signals RRA, RRA+1 (FIG. 13H) are kept the low potential level.

In order to set the word line WL (FIG. 13J) at the non-selection state, the word decode signal RA (FIG. 13I) is firstly made the low potential level, and the word line WL (FIG. 13J) is made the low potential level through the word driver 214.

In response to inactivating the block selection address signal BSA (FIG. 13A) from the address buffer 204, the block selection circuit 201 makes the block selection signal BS (FIG. 13B) the low potential level. That is, the block selection circuit 201 inactivates the block selection signal BS based on the address signal AS.

Based on the block selection signal BS, the main word decoder 215 makes the potential level of the main word line WLP (FIG. 13C) low.

The transistors T201, T206 and T205 are turned off in conjunction with the fact that the potential level of the main word line WLP (FIG. 13C) becomes low. Also, in conjunction with the fact that the potential level of the main word line WLP (FIG. 13C becomes low, the word reset circuit 207 makes the word reset signal WLR (FIG. 13F) the high potential level after a time t202. That is, the word reset signal WLR is inactivated in response to the main word signal.

Thus, after the time t202, the transistor T204 is turned on. Then, after a time t204, the contact R201 (FIG. 13G) becomes the high potential level, and the transistors T203, T208 are turned on. So, the word line WL (FIG. 13J) is kept the low potential level.

In this case, after the transistor T205 is turned off, the transistor T204 is then turned on. Thus, the current does not flow through the transistors T204 and T205.

Figure 15:
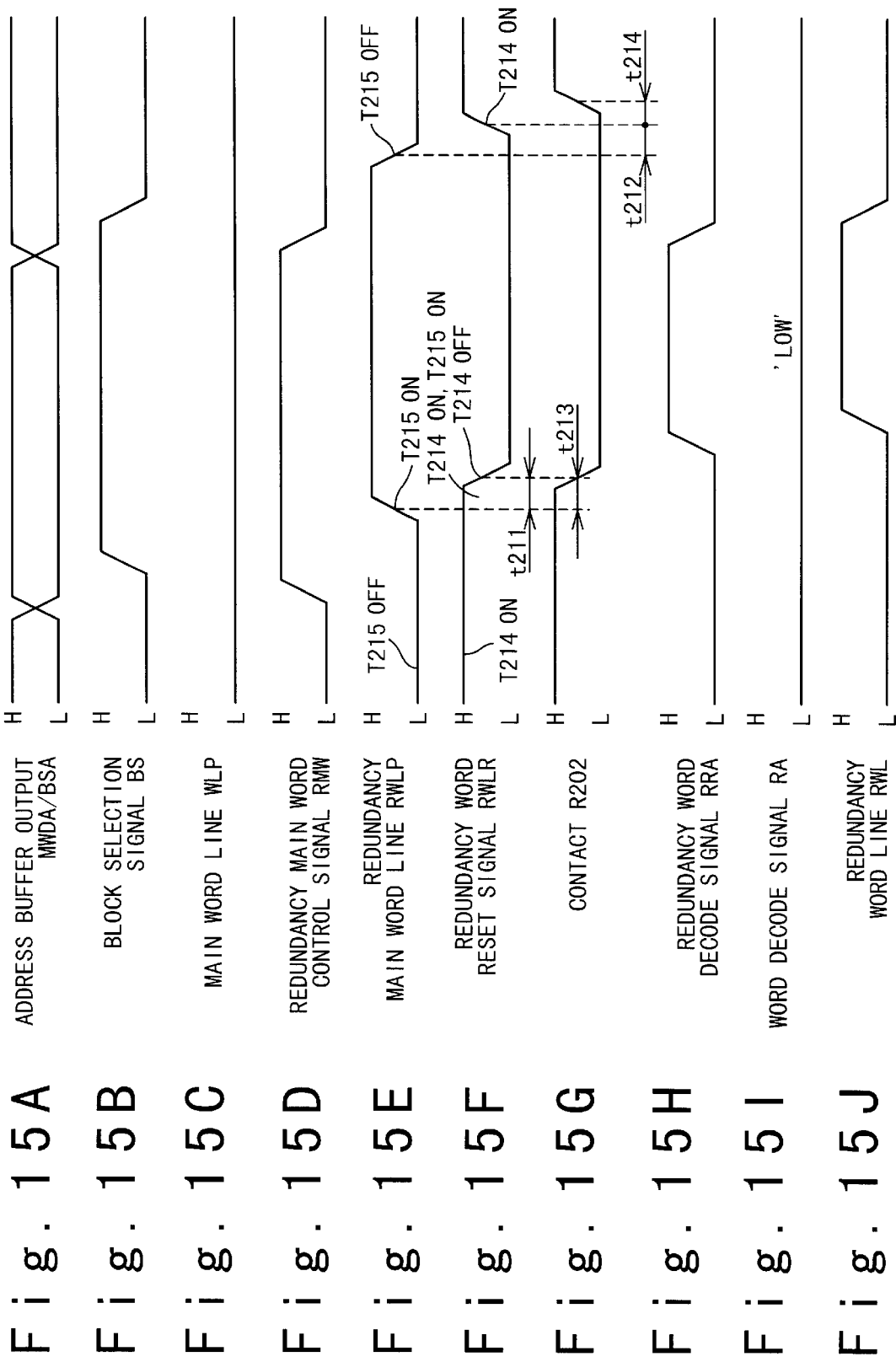
FIG. 15A is an operation timing chart of address buffer outputs of the second embodiment of the present invention.
FIG. 15B is an operation timing chart of a block selection signal of the second embodiment of the present invention.
FIG. 15C is an operation timing chart of the potential level of a main word line of the second embodiment of the present invention.
FIG. 15D is an operation timing chart of a redundancy main word control signal of the second embodiment of the present invention.
FIG. 15E is an operation timing chart of the potential level of a redundancy main word line of the second embodiment of the present invention.
FIG. 15F is an operation timing chart of a redundancy word reset signal of the second embodiment of the present invention.
FIG. 15G is an operation timing chart of the potential level of the contact R202 of the second embodiment of the present invention.
FIG. 15H is an operation timing chart of a redundancy word decode signal of the second embodiment of the present invention.
FIG. 15I is an operation timing chart of a word decode signal of the second embodiment of the present invention.
FIG. 15J is an operation timing chart of the potential level of a redundancy word line of the second embodiment of the present invention.

Next, the case of selecting the redundancy memory cell 221 (not the memory cell 211) will be explained. The operations of the second embodiment regarding the redundancy memory cell 221 will be described below in detail with reference to FIG. 15 showing the operation timing and FIG. 14 showing the circuit diagram of the reset circuit and it's the redundancy word driver circuit 224.

A block selection address signal BSA (FIG. 15A) is generated by the address buffer 204 from the address signal AS. In response to the block selection address signal BSA (FIG. 15A) from the address buffer 204, the block selection circuit 201 makes an block selection signal BS (FIG. 15B) the high potential level. That is, the block selection signal BS is activated based on an address signal AS.

Based on the block selection signal BS (FIG. 15B) and an redundancy main word control signal RMW (FIG. 15D), the redundancy main word decoder 225 selects a redundancy word driver circuits 224. After that, the potential level of the redundancy main word line WLP (FIG. 15E) becomes high. Namely, the redundancy main word decoder 225 activates a redundancy main word signal on the redundancy main word line RWLP based on the block selection signal BS and a redundancy main word control signal RMW. At this timing, the transistors T211, T216 and T215 of FIG. 14 are turned on.

In this circuit, the potential level of the redundancy main word line RWLP (FIG. 15E) and the potential level of the main word line WLP (FIG. 13C) are adjusted so as to be raised and lowered at the substantially same timing. It helps to avoid troubles when the redundancy memory cell 221 is used. However, in this case, the redundancy memory cell 221 is selected. Thus, the potential level of the main word line WLP (FIG. 15C) is kept low.

The redundancy memory cells 221 are prepared as spare memory cells for some broken memory cells of the memory cells 211. That is the reason why the potential level of the redundancy main word line RWLP (FIG. 15E) and the potential level of the main word line WLP (FIG. 13C) are adjusted so as to be raised and lowered at the substantially same timing.

In response to the redundancy main word signal on the redundancy main word line RWLP (FIG. 10E), the redundancy word reset circuit 227 inverts the potential level of the redundancy main word signal. Then, the redundancy word reset circuit 227 outputs a delayed redundancy word reset signal RWLR (FIG. 15F). That is, the redundancy word reset circuit 227 activates the redundancy word reset signal RWLR in response to the redundancy main word signal.

The redundancy word reset signal RWLR (FIG. 15F) becomes the low potential level after a time t211 after the redundancy main word line RWLP (FIG. 15E) becomes the high potential level. Correspondingly to it, the transistor T214 is turned off. As a result, a contact R202 (FIG. 15G) of FIG. 14 which is connected to the source of transistor T214, the drain of the transistor T215, the gate of transistor T213 and the pull-down signal line 224L, becomes the low potential level. And then, the transistors T213 and T218 are turned off.

It takes time t213 from tuning on the transistor T215 to being the low potential level on the contact R202 (FIG. 15G). It takes time t211 from turning on the transistor T215 to turning off the transistor T214 when the redundancy word reset signal RWLR (FIG. 15F) becomes the low potential level.

The time difference between t213 and t211 comes from the difference between one stage of the transistor gate and one stage of the inverter (the word reset circuit 207) + a wiring load.

In the time t211, both of the transistors T214 to T215 are on at the same time. If a voltage difference between the transistors T214 and T215 exceeds a threshold voltage Vt of the transistor T215, a current flows through the transistors T214 and T215.

However, the transistor size of the transistor T215 is reduced to thereby drop the current capacity of the transistor T215. For instance, the transistor T215, which has smaller ratio of the gate width W to the gate length L (W/L) than that of T214, is utilized. By using such transistor T215, the current, which flows through the transistors T214 and T215 until the transistor T214 is turned off, becomes less than the current in the case of not using such transistor T215.

At this time, the transistor T211 and the transistor T216 is on, and the transistor T213 and the transistor T218 is off. Thus, it's ready to receive a redundancy word decode signal RRA (or RA+1).

The redundancy word decode signal RRA (FIG. 15H) is outputted by the redundancy word decoder 223 based on the block selection signal BS and the redundancy word selection signal RWS. In response to the redundancy word decode signal RRA (FIG. 15H), the redundancy word line RWL (FIG. 15J) becomes the high potential level. So, a desirable redundancy memory cell 221 is selected.

The example of FIG. 15 illustrates the case when the redundancy memory cell 221 is selected. Thus, the word decode signals RA, RA+1 (FIG. 15I) are kept the low potential level.

In order to set the redundancy word line RWL (FIG. 15J) at the non-selection state, the redundancy word decode signal RRA (FIG. 15H) is firstly made the low potential level, and the redundancy word line RWL (FIG. 15J) is made the low potential level through the word driver 224.

In response to inactivating the block selection address signal BSA (FIG. 15A) from the address buffer 104, the block selection circuit 201 makes the block selection signal BS (FIG. 15B) the low potential level.

Based on the block selection signal BS, the redundancy main word decoder 225 makes the potential level of the redundancy main word line RWLP (FIG. 15E) low.

The transistors T211, T216 and T215 are turned off in conjunction with the fact that the potential level of the redundancy main word line RWLP (FIG. 15E) becomes low. Also, in conjunction with the fact that the potential level of the redundancy main word line RWLP (FIG. 15E) becomes low, the redundancy word reset circuit 227 makes the redundancy word reset signal RWLR (FIG. 15F) the high potential level after a time t212.

Thus, after the time t212, the transistor T214 is turned on. Then, after a time t214, the contact R202 (FIG. 15G) becomes the high potential level, and the transistors T213, T218 are turned on. So, the redundancy word line RWL (FIG. 15J) is kept the low potential level.

In this case, after the transistor T215 is turned off, the transistor T214 is then turned on. Thus, the current does not flow through the transistors T214 and T215.

(Third Embodiment)

Figure 16:
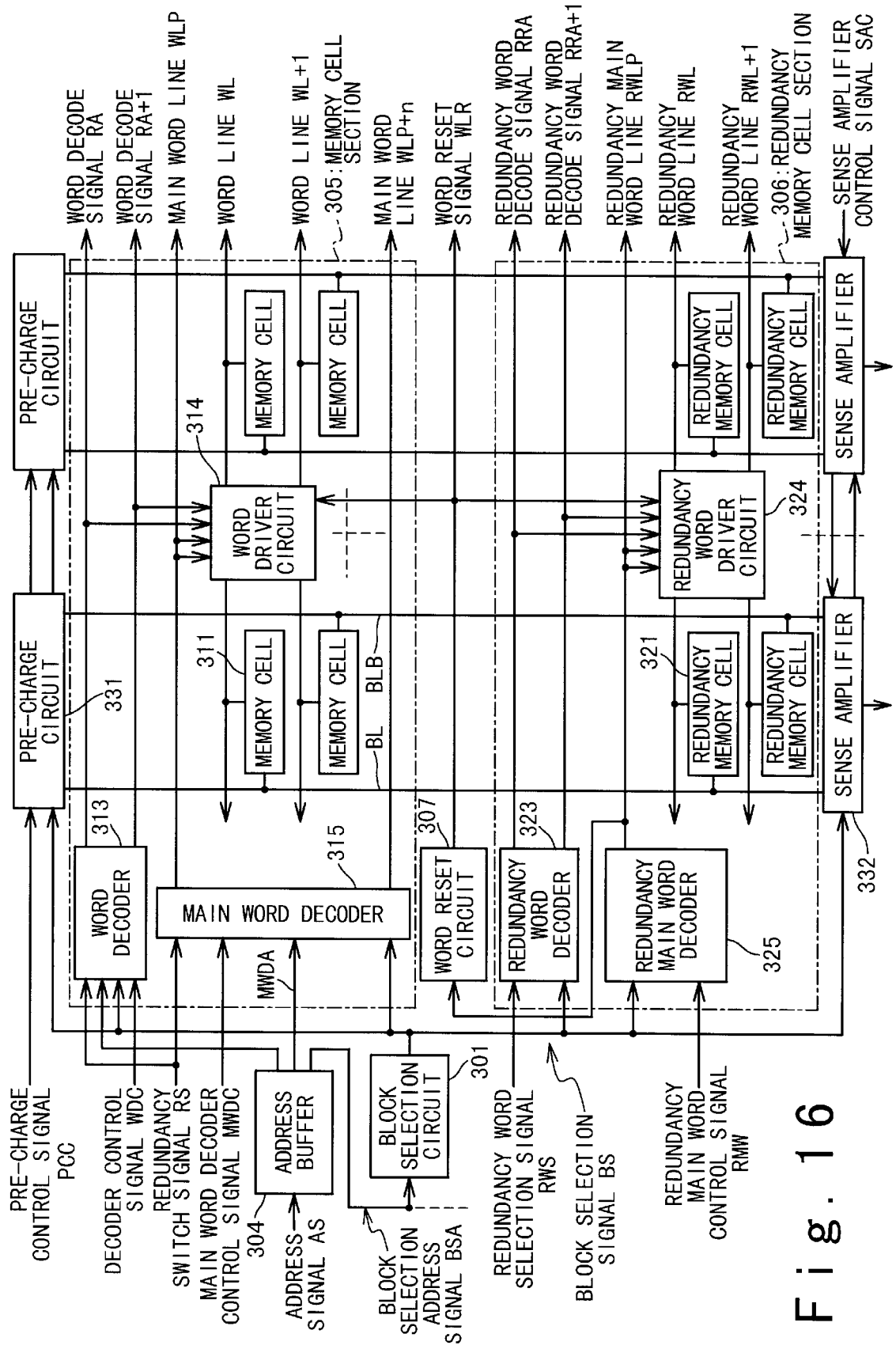
FIG. 16 is a circuit diagram showing a reset circuit of the third embodiment of the present invention.
Figure 17:
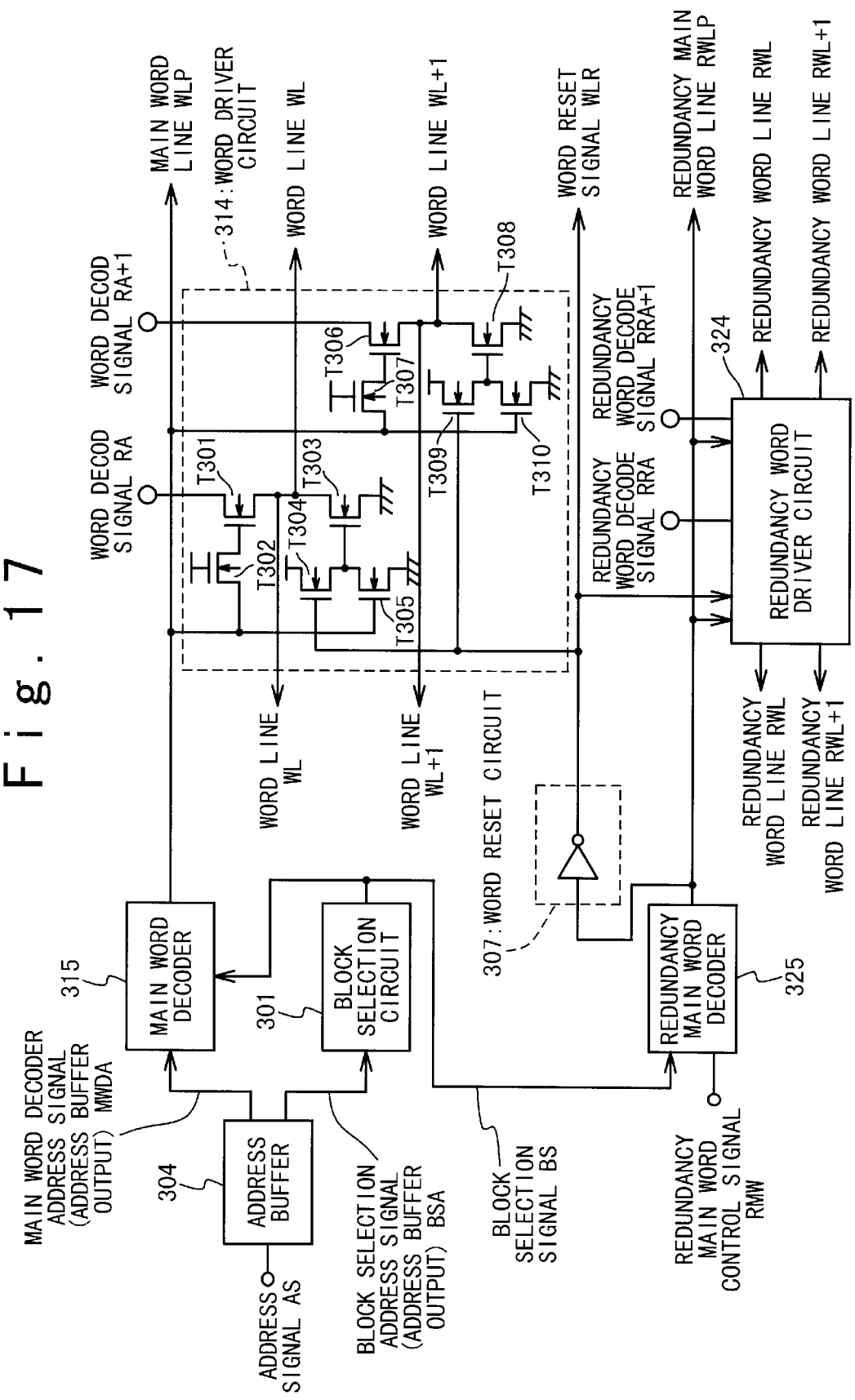
FIG. 17 is a circuit diagram showing a reset circuit and its word driver circuit of the third embodiment of the present invention.
Figure 18:
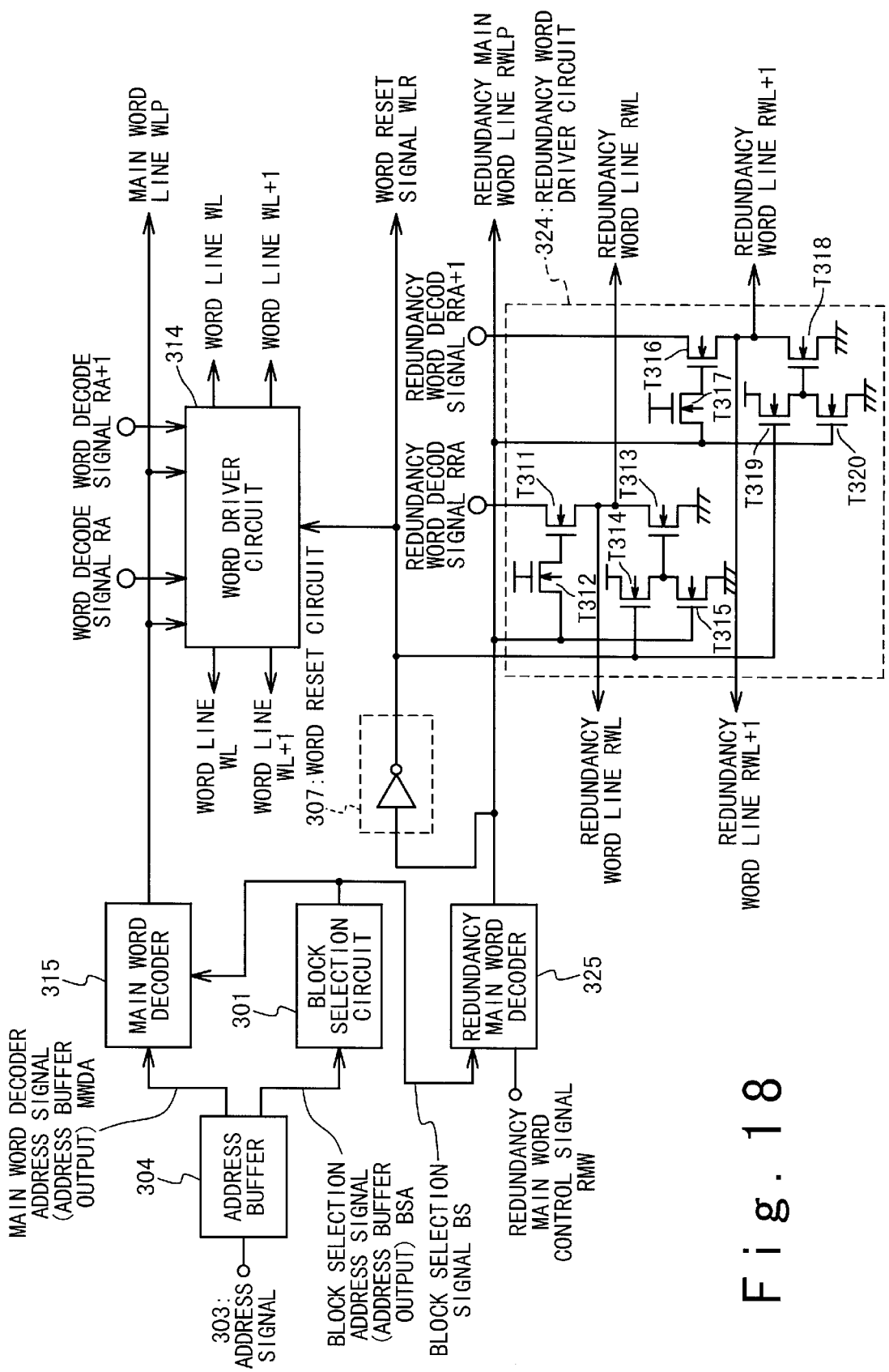
FIG. 18 is a circuit diagram showing a reset circuit and its redundancy word driver circuit of the third embodiment of the present invention.

FIG. 16 is a block diagram showing the configuration of a third embodiment of the present invention. This block diagram is the same as that of the first embodiment. FIG. 17 and FIG. 18 are circuit diagrams showing reset circuits and their word driver circuits of the third embodiment of the present invention.

This third embodiment is designed such that transistors for controlling transistors T303, T308 to fix the word lines (WL, WL+1) of the word driver 314 at the low potential level are respectively individually arranged. It is also designed such that the transistor T303 is controlled by the transistors T304 and T305, and that the transistor T308 is controlled by the transistors T309 and T310.

This third embodiment is designed such that transistors for controlling the transistors T313 and T318 to fix the redundancy word lines (RWL, RWL+1) of the redundancy word driver 324 at the low potential level are respectively individually arranged. It is also designed such that the transistor T313 is controlled by the transistors T314 and T315, and that the transistor T318 is controlled by the transistors T319 and T320.

Except that the double used transistors T304 and T305 (,T314 and T315) are separated, the third embodiment can be considered similarly to the first embodiment. Thus, the explanations of the operation and the configuration in this embodiment are omitted.

The semiconductor memory according to the present invention, since having the above-mentioned configuration, can provide the following effects.

The present invention employs the redundancy main word signal on the redundancy main word line as a input of the word reset circuit. Hence, it is not necessary to consider the variation of memory cell, such as redundancy memory cells. The delay circuit elements do not have to be included in reset circuits. As a result, it is possible to attain the high-speed operation.

According to the present invention, each word driver circuit and each redundancy word driver circuit have their own word reset circuits. Hence, it is not necessary to consider the differences among memory cells. The delay circuit elements do not have to be included in reset circuits. As a result, it is possible to attain the high-speed operation.

In the present invention, the delay circuit elements are reduced to thereby enable the drop in the current. This results in the attainment of the drop in a consumptive electric power.

Since the delay circuit is not necessary, the semiconductor memory can be manufactured at a low cost and may have high reliability.

What is claimed is:

1. A semiconductor memory comprising:
    a block selection circuit outputting a block selection signal based on an address signal;
    a redundancy main word decoder generating a redundancy main word signal in response to said block selection signal;
    a word reset circuit outputting a word reset signal in response to said redundancy main word signal; and
    a word driver circuit which drives one of word lines in response to said word reset signal, a main word signal indicating selection of said word driver circuit, and a word decode signal indicating selection of said one of word lines.

2. The semiconductor memory according to claim 1, wherein said redundancy main word decoder generates said redundancy main word signal in response to a redundancy main word control signal indicating a request for generating said redundancy main word signal, in addition to said block selection signal.

3. The semiconductor memory according to claim 1, further comprising:
    a main word decoder generating said main word signal based on said address signal and said block selection signal; and
    a word decoder outputting said word decode signal based on said address signal and said block selection signal.

4. The semiconductor memory according to claim 1, wherein aid word reset circuit comprises one stage of an inverter or odd number of inverters.

5. The semiconductor memory according to claims 4, wherein said main word signal and said redundancy main word signal become the high potential level or the low potential level at the substantially same time.

6. The semiconductor memory according to claim 4, wherein said word driver circuit comprises:
    a seventeenth transistor having a source connected to said word decoder, a gate connected to a drain of an eighteenth transistor, and a drain connected to one of said word lines;
    said eighteenth transistor having a source connected to said main word decoder, a gate connected to a high potential level power supply, and said drain connected to said gate of said seventeenth transistor;
    a nineteenth transistor having a source connected to a low potential level power supply, a gate connected to a source of a twentieth transistor, and a drain connected to said one of said word lines;
    said twentieth transistor having said source connected to said gate of said nineteenth transistor, a gate connected to said word reset circuit, and a drain connected to a high potential level power supply;
    a twenty-first transistor having a source connected to a low potential level power supply, a gate connected to said main word decoder, and a drain connected to said source of said twentieth transistor;
    a twenty-second transistor having a source connected to said word decoder, a gate connected to a drain of a twenty-third transistor, and a drain connected to another one of said word lines;
    said twenty-third transistor having a source connected to said main word decoder, a gate connected to a high potential level power supply, and said drain connected to said gate of said twenty-second transistor;
    a twenty-fourth transistor having a source connected to a low potential level power supply, a gate connected to a source of a twenty-fifth transistor, and a drain connected to said another one of said word lines;
    said twenty-fifth transistor having said source connected to said gate of said twenty-fourth transistor a gate connected to said word reset circuit, and a drain connected to a high potential level power supply; and
    a twenty-sixth transistor having a source connected to a low potential level power supply, a gate connected to said main word decoder, and a drain connected to said source of said twenty-fifth transistor.

7. The semiconductor memory according to claim 4, wherein said word driver circuit comprises:
    a first transistor having a source connected to said word decoder, a gate connected to a drain of a second transistor, and a drain connected to one of said word lines;
    said second transistor having a source connected to said main word decoder, a gate connected to a high potential level power supply, and said drain connected to said gate of said first transistor;
    a third transistor having a source connected to a low potential level power supply, a gate connected to a first pull-down signal line, and a drain connected to said one of said word lines;
    a fourth transistor having a source connected to said first pull-down signal line, a gate connected to said word reset circuit, and a drain connected to a high potential level power supply;
    a fifth transistor having a source connected to a low potential level power supply, a gate connected to said main word decoder, and a drain connected to said first pull-down signal line;
    a sixth transistor having a source connected to said word decoder, a gate connected to a drain of a seventh transistor, and a drain connected to another one of said word lines;
    said seventh transistor having a source connected to said main word decoder, a gate connected to a high potential level power supply, and said drain connected to said gate of said sixth transistor; and
    an eighth transistor having a source connected to a low potential level power supply, a gate connected to said first pull-down signal line, and a drain connected to said another one of said word lines.

8. The semiconductor memory according to claim 7, wherein a transistor size of said fifth transistor is smaller than that of the fourth transistor.

9. The semiconductor memory according to claim 7, wherein a carrier mobility of said fifth transistor is smaller than that of the fourth transistor.

10. The semiconductor memory according to claim 1, further comprising:

a redundancy word decoder outputting a redundancy word decode signal based on said block selection signal and a redundancy word selection signal indicating selection of said redundancy word decoder; and a redundancy word driver circuit which drives one of redundancy word lines in response to said word reset signal, said redundancy main word signal and said redundancy word decode signal.

11. The semiconductor memory according to claim 10, wherein said word reset circuit comprises one stage of an inverter or odd number of inverters.

12. The semiconductor memory according to claim 11, wherein said main word signal and said redundancy main word signal become the high potential level or the low potential level at the substantially same time.

13. The semiconductor memory according to claim 11, wherein said redundancy word driver circuit comprises:

a twenty-seventh transistor having a source connected to said redundancy word decoder, a gate connected to a drain of a twenty-eighth transistor, and a drain connected to one of said redundancy word lines;

said twenty-eighth transistor having a source connected to said redundancy main word decoder, a gate connected to a high potential level power supply, and said drain connected to said gate of said twenty-seventh transistor;

a twenty-ninth transistor having a source connected to a low potential level power supply, a gate connected to a source of a thirtieth transistor, and a drain connected to said one of said redundancy word lines;

said thirtieth transistor having a source connected to said gate of said twenty-ninth transistor, a gate connected to said word reset circuit, and a drain connected to a high potential level power supply;

a thirty-first transistor having a source connected to a low potential level power supply, a gate connected to said redundancy main word decoder, and a drain connected to said source of thirtieth transistor;

a thirty-second transistor having a source connected to said redundancy word decoder, a gate connected to a drain of a thirty-third transistor, and a drain connected to another one of said redundancy word lines;

said thirty-third transistor having a source connected to said redundancy main word decoder, a gate connected to a high potential level power supply, and said drain connected to said gate of said thirty-second transistor;

a thirty-fourth transistor having a source connected to a low potential level power supply, a gate connected to a source of a thirty-fifth transistor, and a drain connected to said another one of said redundancy word lines;

said thirty-fifth transistor having a source connected to said gate of said thirty-fourth transistor, a gate connected to said word reset circuit, and a drain connected to a high potential level power supply; and a thirty-sixth transistor having a source connected to a low potential level power supply, a gate connected to said redundancy main word decoder, and a drain connected to said source of thirty-fifth transistor.

14. The semiconductor memory according to claim 10, wherein said redundancy word driver circuit comprises:

a ninth transistor having a source connected to said redundancy word decoder, a gate connected to a drain of a tenth transistor, and a drain connected to one of said redundancy word lines;

said tenth transistor having a source connected to said redundancy main word decoder, a gate connected to a high potential level power supply, and said drain connected to said gate of said ninth transistor;

an eleventh transistor having a source connected to a low potential level power supply, a gate connected to a second pull-down signal line, and a drain connected to said one of said redundancy word lines;

a twelfth transistor having a source connected to said second pull-down signal line, a gate connected to said word reset circuit, and a drain connected to a high potential level power supply;

a thirteenth transistor having a source connected to a low potential level power supply, a gate connected to said redundancy main word decoder, and a drain connected to said second pull-down signal line;

a fourteenth transistor having a source connected to said redundancy word decoder, a gate connected to a drain of a fifteenth transistor, and a drain connected to another one of said redundancy word lines;

said fifteenth transistor having a source connected to said redundancy main word decoders a gate connected to a high potential level power supply, and said drain connected to said gate of said fourteenth transistor; and a sixteenth transistor having a source connected to a low potential level power supply, a gate connected to said second pull-down signal line, and a drain connected to said another one of said redundancy word lines.

15. The semiconductor memory according to claim 14, wherein a transistor size of said thirteenth transistor is smaller than that of the twelfth transistor.

16. A semiconductor memory comprising:

a block selection circuit outputting a block selection signal based on an address signal;

a main word decoder generating a main word signal based on said address signal and said block selection signal;

a word reset circuit outputting a word reset signal in response to said main word signal; and a word driver circuit which drives one of word lines in response to said word reset signal, said main word signal and a word decode signal.

17. The semiconductor memory according to claim 16, further comprising:

a word decoder outputting said word decode signal based on said address signal and said block selection signal.

18. The semiconductor memory according to claims 16, wherein said word reset circuit comprises one stage of an inverter or odd number of inverters.

19. The semiconductor memory according to claim 18, wherein said word driver circuit comprises:

a first transistor having a source connected to said word decoder, a gate connected to a drain of a second transistor, and a drain connected to one of said word lines;

said second transistor having a source connected to said main word decoder, a gate connected to a high potential level power supply, and said drain connected to said gate of said first transistor;

a third transistor having a source connected to a low potential level power supply, a gate connected to a first pull-down signal line, and a drain connected to said one of said word lines;

a fourth transistor having a source connected to said first pull-down signal line, a gate connected to said word reset circuit, and a drain connected to a high potential level power supply;

a fifth transistor having a source connected to a low potential level power supply, a gate connected to said main word decoder, and a drain connected to said first pull-down signal line;

a sixth transistor having a source connected to said word decoder, a gate connected to a drain of a seventh transistor, and a drain connected to another one of said word lines;

said seventh transistor having a source connected to said main word decoder, a gate connected to a high potential level power supply, and said drain connected to said gate of said sixth transistor; and an eighth transistor having a source connected to a low potential level power supply, a gate connected to said first pull-down signal line, and a drain connected to said another one of said word lines.

20. The semiconductor memory according to claim 19, wherein a transistor size of said fifth transistor is smaller than that of the fourth transistor.

21. The semiconductor memory according to claim 16, further comprising:

a redundancy main word decoder generating a redundancy main word signal based on said block selection signal and a redundancy main word control signal indicating a request for generating said redundancy main word signal;

a redundancy word decoder outputting a redundancy word decode signal based on said block selection signal and a redundancy word selection signal;

a redundancy word reset circuit outputting a redundancy word reset signal in response to said redundancy main word signal; and a redundancy word driver circuit which drives one of redundancy word lines in response to said redundancy word reset signal, said redundancy main word signal and said redundancy word decode signal.

22. The semiconductor memory according to claims 21, wherein said redundancy word reset circuit comprises one stage of an inverter or odd number of inverters.

23. The semiconductor memory according to claim 22, wherein said redundancy word driver circuit comprises:

a ninth transistor having a source connected to said redundancy word decoder, a gate connected to a drain of a tenth transistor, and a drain connected to one of said redundancy word lines;

said tenth transistor having a source connected to said redundancy main word decoder, a gate connected to a high potential level power supply, and said drain connected to said gate of said ninth transistor;

an eleventh transistor having a source connected to a low potential level power supply, a gate connected to a second pull-down signal line, and a drain connected to said one of said redundancy word lines;

a twelfth transistor having a source connected to said second pull-down signal line, a gate connected to said word redundancy reset circuit, and a drain connected to a high potential level power supply;

a thirteenth transistor having a source connected to a low potential level power supply, a gate connected to said redundancy main word decoder, and a drain connected to said second pull-down signal line;

a fourteenth transistor having a source connected to said redundancy word decoder, a gate connected to a drain of a fifteenth transistor, and a drain connected to another one of said redundancy word lines;

said fifteenth transistor having a source connected to said redundancy main word decoder, a gate connected to a high potential level power supply, and said drain connected to said gate of said fourteenth transistor; and a sixteenth transistor having a source connected to a low potential level power supply, a gate connected to said second pull-down signal line, and a drain connected to said another one of said redundancy word lines.

24. The semiconductor memory according to claim 23, wherein a transistor size of said thirteenth transistor is smaller than that of the twelfth transistor.

25. A method of driving a word line, comprising the steps of:

(a) activating a block selection signal based on an address signal;

(b) activating a redundancy main word signal in response to said block selection signal;

(c) activating a word reset signal in response to said redundancy main word signal; and (d) activating a word line base on said word reset signal, a main word signal, and a word decode signal.

26. The method according to claim 25, wherein said (b) activating said redundancy main word signal step comprises the steps of:

(e) activating said redundancy main word signal in response to a redundancy main word control signal indicating a request for generating said redundancy main word signal, in addition to said block selection signal.

27. The method according to claim 25, wherein said (d) activating a word line step comprises the steps of:

(f) activating said main word signal based on said address signal and said block selection signal; and (g) activating said word decode signal based on said address signal and said block selection signal.

28. The method according to claim 25, further comprising the steps of:

(h) inactivating a word line in response to the word decode signal;

(i) inactivating said block selection signal based on said address signal;

(j) inactivating a redundancy main word signal based on said block selection signal and said redundancy main word control signal; and (k) inactivating a word reset signal in response to said redundancy main word signal.

* * * * *

UNITED STATES PATENT AND TRADEMARK OFFICE
CERTIFICATE OF CORRECTION

PATENT NO. : 6,392,956 B2
DATED : May 21, 2002
INVENTOR(S) : Yoshinori Matsui and Hiroyuki Yamakoshi It is certified that error appears in the above-identified patent and that said Letters Patent is hereby corrected as shown below:

<u>Column 14,</u>
Line 61, delete "I11" insert -- 111 --.

<u>Column 18,</u>
Line 7, delete "till" insert -- t111 --;
Line 13, delete "till" insert -- t111 --

<u>Column 25,</u>
Line 43, delete "aid" insert -- said --

Signed and Sealed this

Third day of September, 2002

Attest:

JAMES E. ROGAN
*Attesting Officer*       *Director of the United States Patent and Trademark Office*